(12) United States Patent
Barnes et al.

(10) Patent No.: US 9,320,174 B2
(45) Date of Patent: *Apr. 19, 2016

(54) MANAGEMENT OF EXTERIOR TEMPERATURES ENCOUNTERED BY USER OF A PORTABLE ELECTRONIC DEVICE IN RESPONSE TO AN INFERRED USER CONTACT WITH THE PORTABLE ELECTRONIC DEVICE

(71) Applicant: Elwha LLC, Bellevue, WA (US)

(72) Inventors: Philip Lionel Barnes, Seattle, WA (US); Hon Wah Chin, Palo Alto, CA (US); Howard Lee Davidson, San Mateo, CA (US); Kimberly D. A. Hallman, Bellevue, WA (US); Roderick A. Hyde, Redmond, WA (US); Muriel Y. Ishikawa, Livermore, CA (US); Jordin T. Kare, San Jose, CA (US); Brian Lee, Redmond, WA (US); Richard T. Lord, Gig Harbor, WA (US); Robert W. Lord, Seattle, WA (US); Craig J. Mundie, Seattle, WA (US); Nathan P. Myhrvold, Medina, WA (US); Nicholas F. Pasch, Redmond, WA (US); Eric D. Rudder, Mercer Island, WA (US); Clarence T. Tegreene, Mercer Island, WA (US); Marc Tremblay, Clyde Hill, WA (US); David B. Tuckerman, Lafayette, CA (US); Charles Whitmer, North Bend, WA (US); Lowell L. Wood, Jr., Bellevue, WA (US)

(73) Assignee: Elwha LLC, Bellevue, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/591,342

(22) Filed: Jan. 7, 2015

(65) Prior Publication Data
US 2015/0124408 A1    May 7, 2015

Related U.S. Application Data

(63) Continuation of application No. 13/800,725, filed on Mar. 13, 2013, now Pat. No. 8,971,043.

(51) Int. Cl.
*H05K 7/20*    (2006.01)
*G06F 1/20*    (2006.01)

(52) U.S. Cl.
CPC ............ *H05K 7/20409* (2013.01); *G06F 1/203* (2013.01); *G06F 1/206* (2013.01)

(58) Field of Classification Search
USPC ......................................... 361/707, 714, 705
See application file for complete search history.

(56) References Cited

U.S. PATENT DOCUMENTS

| 5,609,920 A | 3/1997 | Riepenhausen |
| 6,724,626 B1 | 4/2004 | Hodes et al. |

(Continued)

FOREIGN PATENT DOCUMENTS

| JP | 10-229287 A | 8/1998 |
| JP | 2000-130884 A | 5/2000 |

(Continued)

OTHER PUBLICATIONS

PCT International Search Report; International App. No. PCT/US2014/023389; Jun. 27, 2014; pp. 1-3.

(Continued)

*Primary Examiner* — Andargie M Aychillhum

(57) ABSTRACT

Described embodiments include a portable electronic device. The device includes a shell housing components of the portable electronic device having a heat-generating component. The device includes a heat-rejection element located at an exterior surface of the shell. The heat-rejection element is configured to reject heat received from the heat-generating component into an environment in thermal contact with the heat-rejection element. The device includes a controllable thermal coupler configured to regulate heat transfer to the heat-rejection element. The device includes an activity monitor configured to infer a user touch to the shell in response to a detected activity of the portable electronic device. The device includes a thermal manager configured to regulate heat transfer by the controllable thermal coupler to the heat-rejection element in response to the inferred user touch.

11 Claims, 17 Drawing Sheets

(56) References Cited

U.S. PATENT DOCUMENTS

| | | |
|---|---|---|
| 7,031,155 B2 | 4/2006 | Sauciuc et al. |
| 7,292,441 B2 | 11/2007 | Smalc et al. |
| 7,486,517 B2 * | 2/2009 | Aapro et al. .................. 361/714 |
| 2003/0163025 A1 * | 8/2003 | Kaji .............................. 600/132 |
| 2004/0018918 A1 * | 1/2004 | Reyes et al. ..................... 482/54 |
| 2004/0190251 A1 | 9/2004 | Prasher et al. |
| 2005/0117300 A1 | 6/2005 | Prasher et al. |
| 2006/0104034 A1 | 5/2006 | Tsai et al. |
| 2006/0215362 A1 | 9/2006 | Cho |
| 2006/0283579 A1 | 12/2006 | Ghosh et al. |
| 2007/0034356 A1 | 2/2007 | Kenny et al. |
| 2008/0013283 A1 | 1/2008 | Gilbert et al. |
| 2009/0021908 A1 | 1/2009 | Patel et al. |
| 2009/0145579 A1 | 6/2009 | Senyk et al. |
| 2010/0304250 A1 | 12/2010 | Chan et al. |
| 2011/0235255 A1 | 9/2011 | Cheng et al. |
| 2011/0292560 A1 | 12/2011 | Jewell-Larsen et al. |
| 2012/0087384 A1 | 4/2012 | Zayer et al. |
| 2012/0121487 A1 | 5/2012 | Jewell-Larsen et al. |
| 2012/0307452 A1 | 12/2012 | Yan et al. |
| 2013/0141351 A1 | 6/2013 | Aisaka et al. |

FOREIGN PATENT DOCUMENTS

| | | |
|---|---|---|
| JP | 2000-250658 A | 9/2000 |
| JP | 2001-111280 A | 4/2001 |
| JP | 2002-164975 A | 6/2002 |
| JP | 2007-034699 A | 2/2007 |
| JP | 2010-237750 A | 10/2010 |
| JP | 2010-251634 A | 11/2010 |

OTHER PUBLICATIONS

PCT International Search Report; International App. No. PCT/US2014/023414; Jul. 8, 2014; pp. 1-3.

* cited by examiner

FIG. 5
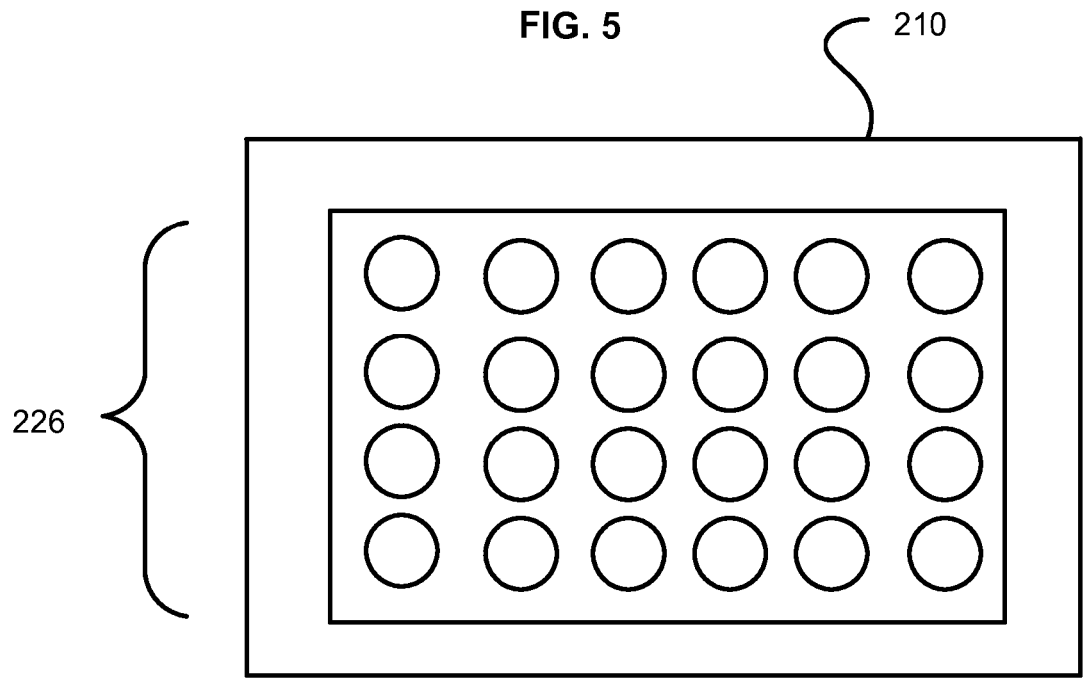
FIG. 5A
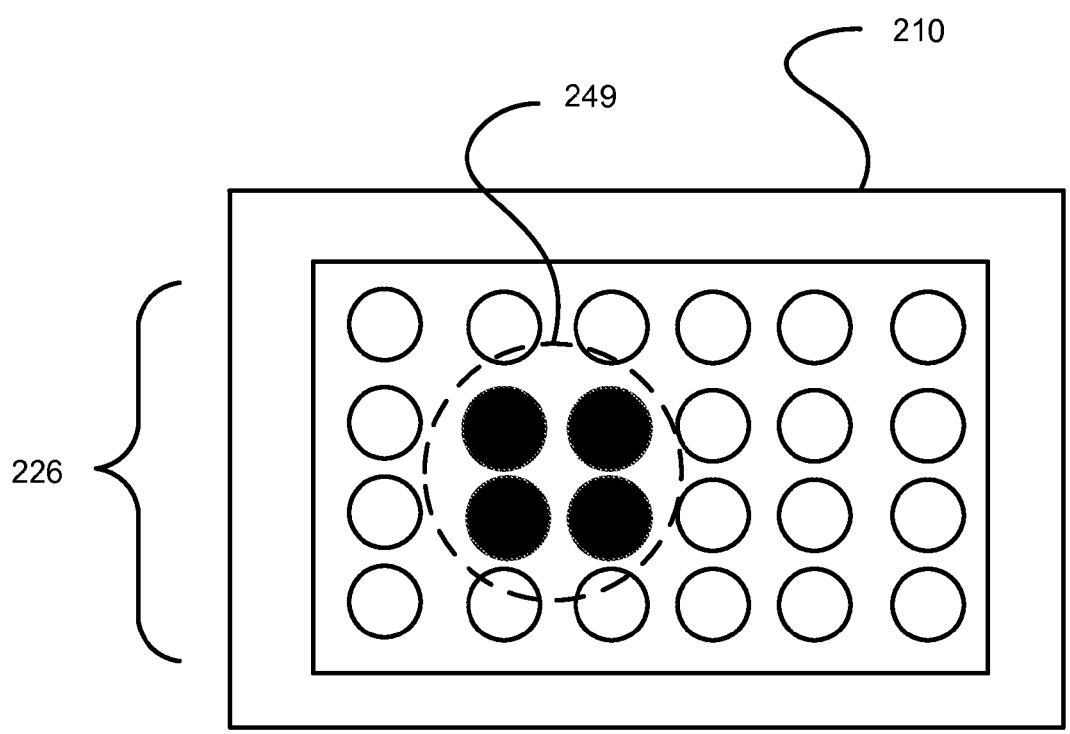
FIG. 5B

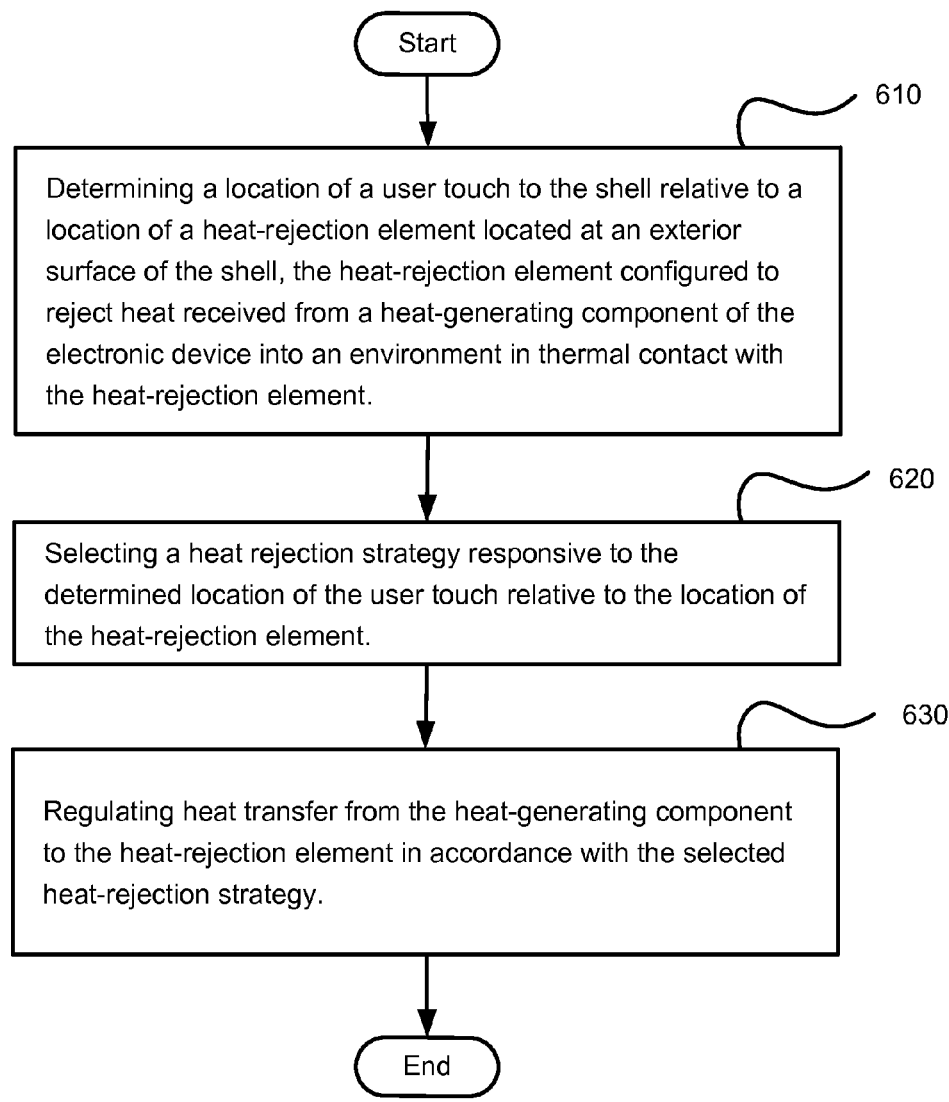

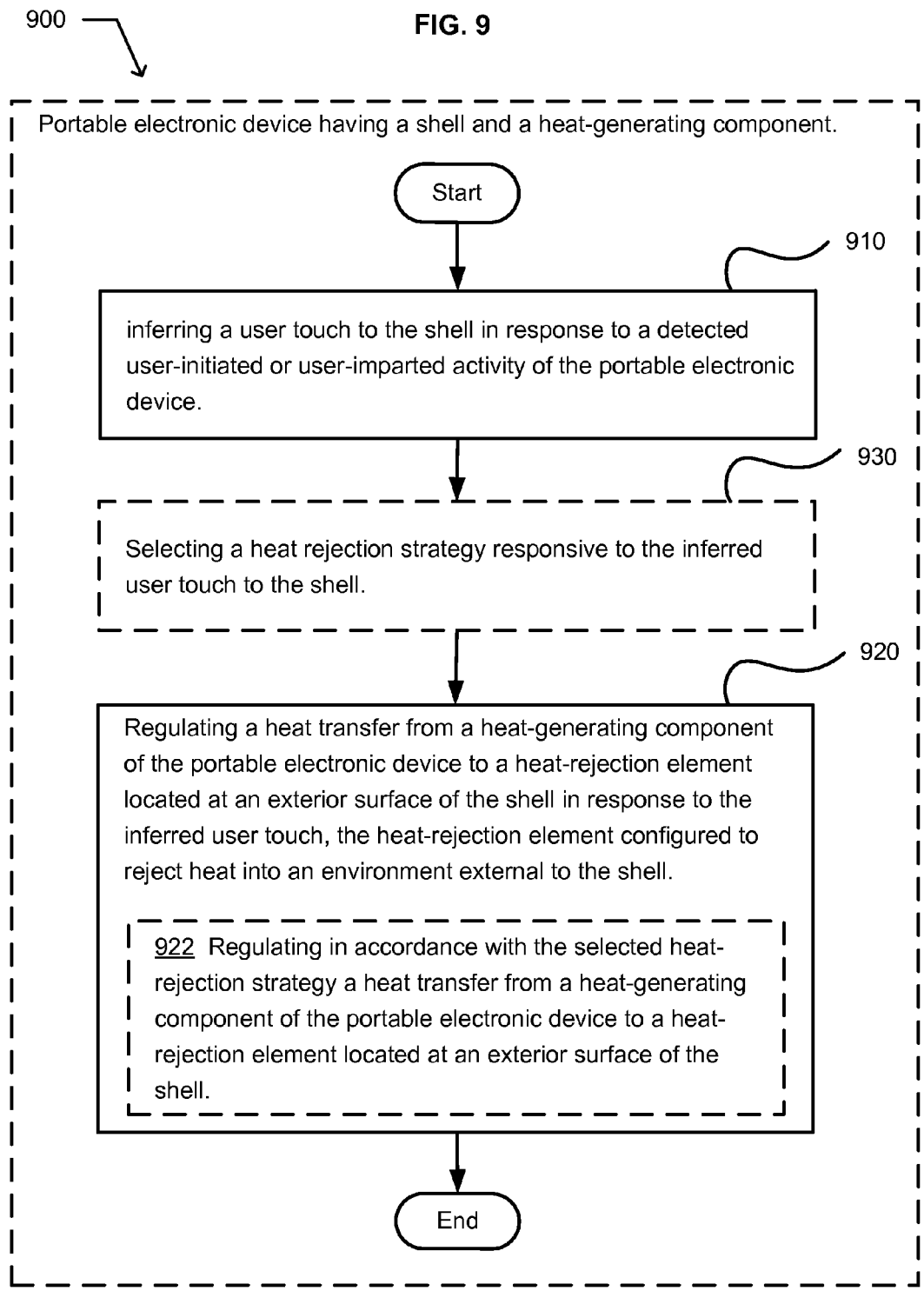

A portable electronic device having an exterior shell and a heat-generating component.

1010 Means for inferring a user touch to the shell in response to a detected user-initiated or user-imparted activity of a portable electronic device.

1020 Means for selecting a heat rejection strategy responsive to the inferred user touch to the shell.

1030 Means regulating in accordance with the selected heat-rejection strategy heat transfer from a heat-generating component of the portable electronic device to a heat-rejection element located at an exterior surface of the shell.

```
┌─────────────────────────────────────────────────────────────────┐
│ Portable electronic device having a shell and a heat-generating │
│ component.                                                       │
│                                                                  │
│                          ( Start )                               │
│                             │                                    │
│                             ▼                        1210        │
│   ┌──────────────────────────────────────────────┐              │
│   │ Determining if a user touch to the shell is  │              │
│   │ within a first zone of possible heat         │              │
│   │ discomfort defined for a first heat-rejection│              │
│   │ element.                                     │              │
│   └──────────────────────────────────────────────┘              │
│                             │                        1220        │
│                             ▼                                    │
│   ┌──────────────────────────────────────────────┐              │
│   │ Selecting a heat rejection strategy responsive to a│        │
│   │ determination that the user touch to the shell is  │        │
│   │ within the first zone of possible heat discomfort, │        │
│   │ the selected heat rejection strategy includes     │        │
│   │ adjusting heat rejection away from the first      │        │
│   │ heat-rejection element and toward the second     │        │
│   │ heat-rejection element.                          │        │
│   └──────────────────────────────────────────────┘              │
│                             │                        1230        │
│                             ▼                                    │
│   ┌──────────────────────────────────────────────┐              │
│   │ Regulating heat transfer to the first heat-rejection │      │
│   │ element and to the second heat-rejection element    │      │
│   │ in response to the selected heat rejection strategy.│      │
│   └──────────────────────────────────────────────┘              │
│                             │                                    │
│                             ▼                                    │
│                          ( End )                                 │
│                                                                  │
│   ┌──────────────────────────────────────────────┐              │
│   │ The first heat-rejection element located at a first │       │
│   │ exterior portion of the shell and the second       │       │
│   │ heat-rejection element located at a second exterior│       │
│   │ portion of the shell, each heat-rejeciton element  │       │
│   │ configured to reject heat received from the        │       │
│   │ heat-generating component into an environment in   │       │
│   │ thermal contact with the shell.                    │       │
│   └──────────────────────────────────────────────┘              │
└─────────────────────────────────────────────────────────────────┘
```

A portable electronic device having an exterior shell and a heat-generating component.

1310 Means for determining if a user touch to a shell of the portable electronic device is within a first zone of possible heat discomfort defined for a first heat-rejection element of the portable electronic device.

1320 Means for selecting a heat rejection strategy responsive to a determination that the user touch to the shell is within the first zone of possible heat discomfort, the selected heat rejection strategy includes adjusting heat rejection away from the first heat-rejection element and toward a second heat-rejection element.

1330 Means for regulating heat transfer to the first heat-rejection element and to the second heat-rejection element in response to the selected heat rejection strategy.

The first heat-rejection element located at a first exterior portion of the shell and the second heat-rejection element located at a second exterior portion of the shell, each heat-rejection element configured to reject heat received from the heat-generating component of the portable electronic device into an environment in thermal contact with the shell.

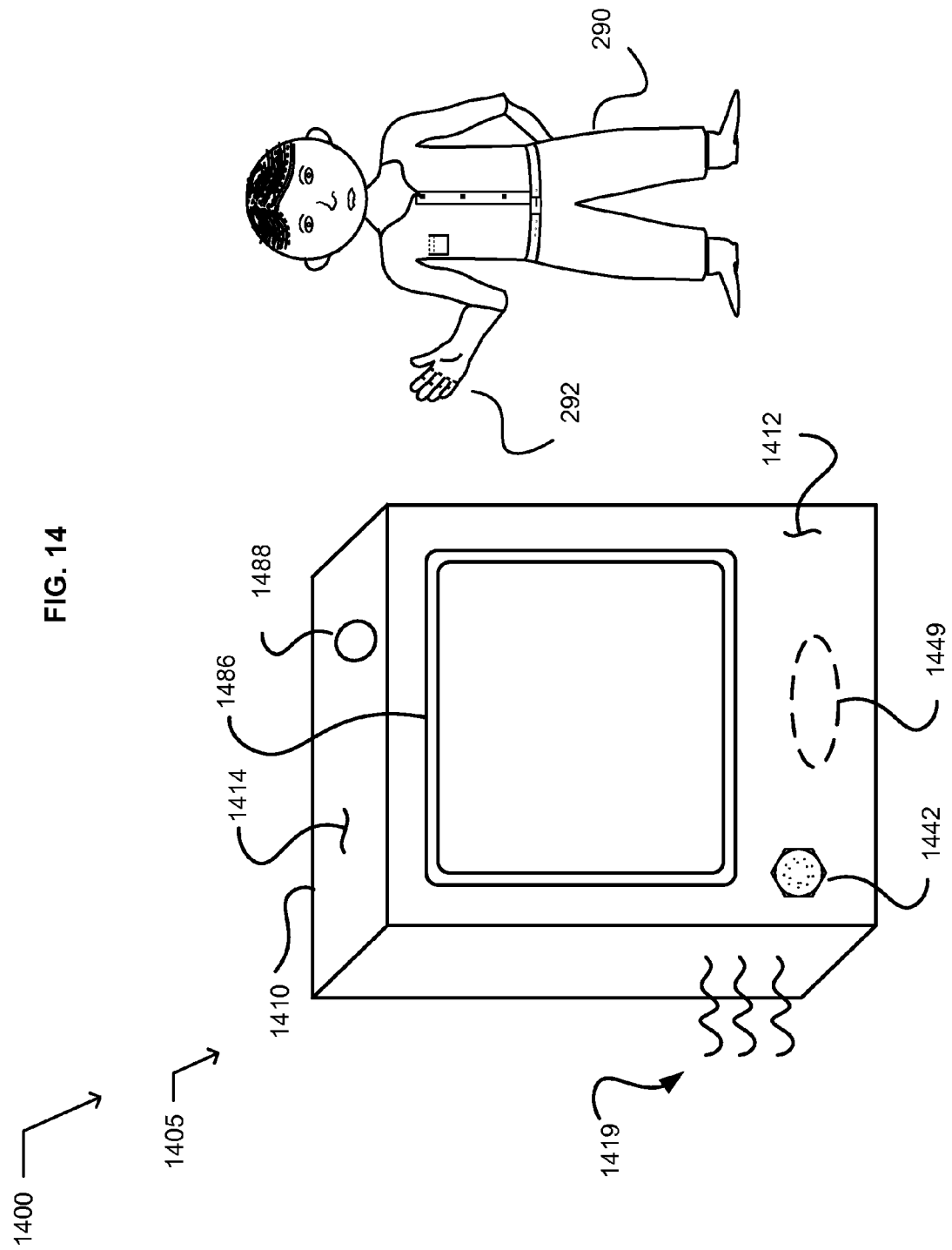

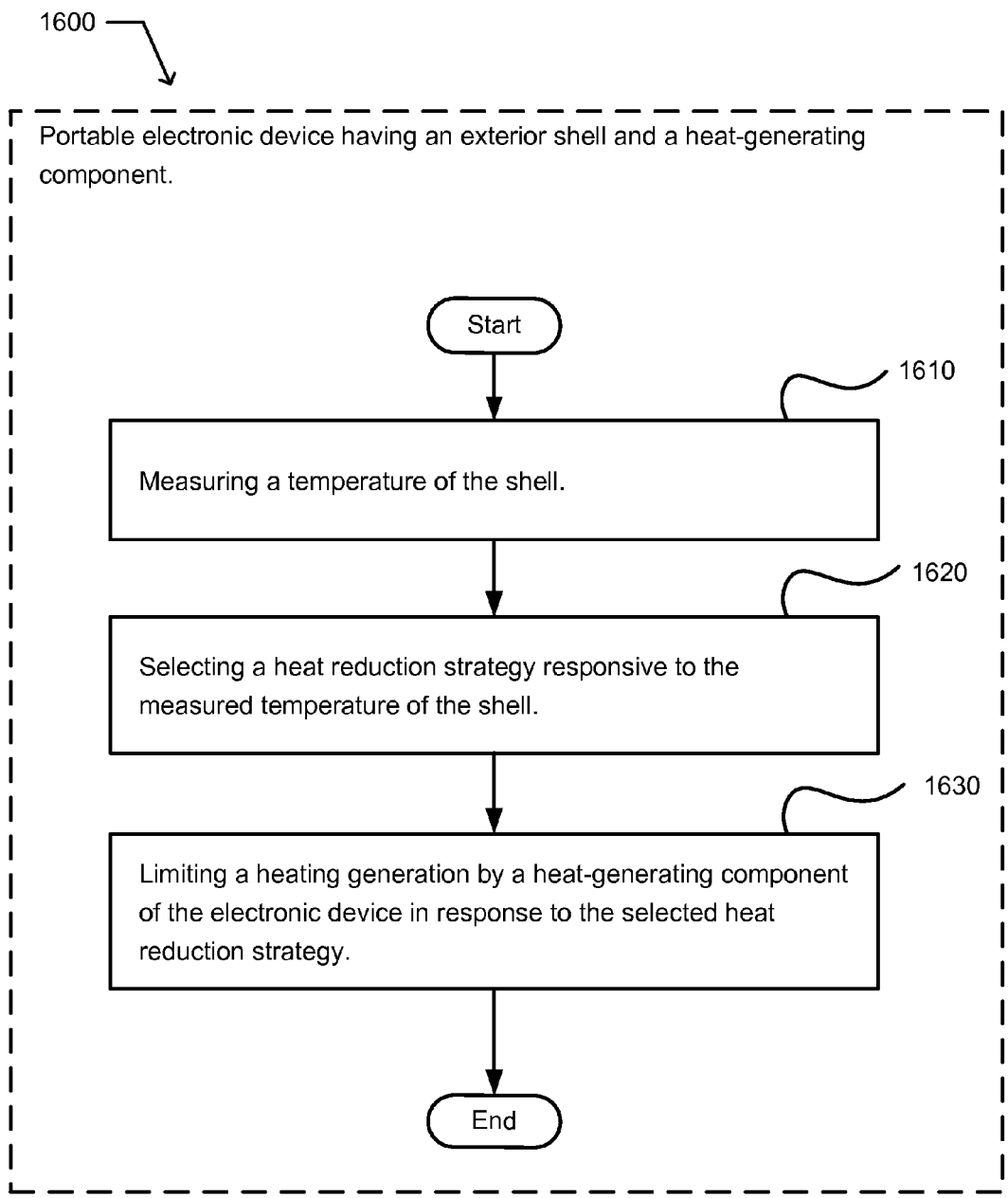

MANAGEMENT OF EXTERIOR TEMPERATURES ENCOUNTERED BY USER OF A PORTABLE ELECTRONIC DEVICE IN RESPONSE TO AN INFERRED USER CONTACT WITH THE PORTABLE ELECTRONIC DEVICE

If an Application Data Sheet (ADS) has been filed on the filing date of this application, it is incorporated by reference herein. Any applications claimed on the ADS for priority under 35 U.S.C. §§119, 120, 121, or 365(c), and any and all parent, grandparent, great-grandparent, etc. applications of such applications, are also incorporated by reference, including any priority claims made in those applications and any material incorporated by reference, to the extent such subject matter is not inconsistent herewith.

CROSS-REFERENCE TO RELATED APPLICATIONS

The present application is related to and/or claims the benefit of the earliest available effective filing date(s) from the following listed application(s) (the "Priority Applications"), if any, listed below (e.g., claims earliest available priority dates for other than provisional patent applications or claims benefits under 35 USC §119(e) for provisional patent applications, for any and all parent, grandparent, great-grandparent, etc. applications of the Priority Application(s)). In addition, the present application is related to the "Related Applications," if any, listed below.

PRIORITY APPLICATIONS

The present application constitutes a continuation of U.S. patent application Ser. No. 13/800,725, entitled MANAGEMENT OF EXTERIOR TEMPERATURES ENCOUNTERED BY USER OF A PORTABLE ELECTRONIC DEVICE IN RESPONSE TO AN INFERRED USER CONTACT WITH THE PORTABLE ELECTRONIC DEVICE, naming Philip L. Barnes, Hon Wah Chin, Howard L. Davidson, Kimberly D. A. Hallman, Roderick A. Hyde, Muriel Y. Ishikawa, Jordin T. Kare, Brian Lee, Richard T. Lord, Robert W. Lord, Craig J. Mundie, Nathan P. Myhrvold, Nicholas F. Pasch, Eric D. Rudder, Clarence T. Tegreene, Marc Tremblay, David B. Tuckerman, Charles Whitmer and Lowell L. Wood, Jr. as inventors, filed 13 Mar. 2013.

None.

RELATED APPLICATIONS

U.S. patent application Ser. No. 13/800,597, entitled MANAGEMENT OF EXTERIOR TEMPERATURES ENCOUNTERED BY USER OF A PORTABLE ELECTRONIC DEVICE, naming Philip L. Barnes, Hon Wah Chin, Howard L. Davidson, Kimberly D. A. Hallman, Roderick A. Hyde, Muriel Y. Ishikawa, Jordin T. Kare, Brian Lee, Richard T. Lord, Robert W. Lord, Craig J. Mundie, Nathan P. Myhrvold, Nicholas F. Pasch, Eric D. Rudder, Clarence T. Tegreene, Marc Tremblay, David B. Tuckerman, Charles Whitmer, and Lowell L. Wood, Jr. as inventors, filed 13 Mar. 2013, is related to the present application.

U.S. patent application Ser. No. 13/800,791, entitled MANAGEMENT OF EXTERIOR TEMPERATURES ENCOUNTERED BY USER OF A PORTABLE ELECTRONIC DEVICE USING MULTIPLE HEAT-REJECTION ELEMENTS, naming Philip L. Barnes, Hon Wah Chin, Howard L. Davidson, Kimberly D. A. Hallman, Roderick A. Hyde, Muriel Y. Ishikawa, Jordin T. Kare, Brian Lee, Richard T. Lord, Robert W. Lord, Craig J. Mundie, Nathan P. Myhrvold, Nicholas F. Pasch, Eric D. Rudder, Clarence T. Tegreene, Marc Tremblay, David B. Tuckerman, Charles Whitmer, and Lowell L. Wood, Jr. as inventors, filed 13 Mar. 2013, is related to the present application.

U.S. patent application Ser. No. 13/800,888, entitled MANAGEMENT OF EXTERIOR TEMPERATURES ENCOUNTERED BY USER OF A PORTABLE ELECTRONIC DEVICE BY REDUCING HEAT GENERATION BY A COMPONENT, naming Philip L. Barnes, Hon Wah Chin, Howard L. Davidson, Kimberly D. A. Hallman, Roderick A. Hyde, Muriel Y. Ishikawa, Jordin T. Kare, Brian Lee, Richard T. Lord, Robert W. Lord, Craig J. Mundie, Nathan P. Myhrvold, Nicholas F. Pasch, Eric D. Rudder, Clarence T. Tegreene, Marc Tremblay, David B. Tuckerman, Charles Whitmer, and Lowell L. Wood, Jr. as inventors, filed 13 Mar. 2013, is related to the present application.

The United States Patent Office (USPTO) has published a notice to the effect that the USPTO's computer programs require that patent applicants reference both a serial number and indicate whether an application is a continuation, continuation-in-part, or divisional of a parent application. Stephen G. Kunin, Benefit of Prior-Filed Application, USPTO Official Gazette Mar. 18, 2003. The USPTO further has provided forms for the Application Data Sheet which allow automatic loading of bibliographic data but which require identification of each application as a continuation, continuation-in-part, or divisional of a parent application. The present Applicant Entity (hereinafter "Applicant") has provided above a specific reference to the application(s) from which priority is being claimed as recited by statute. Applicant understands that the statute is unambiguous in its specific reference language and does not require either a serial number or any characterization, such as "continuation" or "continuation-in-part," for claiming priority to U.S. patent applications. Notwithstanding the foregoing, Applicant understands that the USPTO's computer programs have certain data entry requirements, and hence Applicant has provided designation(s) of a relationship between the present application and its parent application(s) as set forth above and in any ADS filed in this application, but expressly points out that such designation(s) are not to be construed in any way as any type of commentary and/or admission as to whether or not the present application contains any new matter in addition to the matter of its parent application(s).

If the listings of applications provided above are inconsistent with the listings provided via an ADS, it is the intent of the Applicant to claim priority to each application that appears in the Priority Applications section of the ADS and to each application that appears in the Priority Applications section of this application.

All subject matter of the Priority Applications and the Related Applications and of any and all parent, grandparent, great-grandparent, etc. applications of the Priority Applications and the Related Applications, including any priority claims, is incorporated herein by reference to the extent such subject matter is not inconsistent herewith.

SUMMARY

For example, and without limitation, an embodiment of the subject matter described herein includes a portable electronic device. The portable electronic device includes a shell housing components of the portable electronic device and a heat-generating component of the portable electronic device. The portable electronic device includes a heat-rejection element located at an exterior surface of the shell. The heat-rejection element is configured to reject heat received from the heat-generating component into an environment in thermal contact with the heat-rejection element. The portable electronic device includes a controllable thermal coupler configured to regulate heat transfer to the heat-rejection element. The portable electronic device includes an activity monitor configured to infer a user touch to the shell in response to a detected activity of the portable electronic device. The portable electronic device includes a thermal manager configured to regulate heat transfer by the controllable thermal coupler to the heat-rejection element in response to the inferred user touch.

For example, and without limitation, an embodiment of the subject matter described herein includes a method of limiting exterior shell temperatures encountered by a user of a portable electronic device. The method includes inferring a user touch to the shell in response to a detected user-initiated or user-imparted activity of the portable electronic device. The method includes regulating a heat transfer from a heat-generating component of the portable electronic device to a heat-rejection element located at an exterior surface of the shell in response to the inferred user touch. The heat-rejection element is configured to reject heat into an environment external to the shell. In an embodiment, the method includes selecting a heat rejection strategy responsive to the inferred user touch to the shell.

For example, and without limitation, an embodiment of the subject matter described herein includes a system for limiting exterior shell temperatures encountered by a user of a portable electronic device. The system includes means for inferring a user touch to a shell in response to a detected user-initiated or user-imparted activity of a portable electronic device. The system includes means for selecting a heat rejection strategy responsive to the inferred user touch to the shell. The system includes means for regulating in accordance with the selected heat-rejection strategy heat transfer from a heat-generating component of the portable electronic device to a heat-rejection element located at an exterior surface of the shell.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 5, including FIGS. 5A and 5B, illustrates an embodiment where the heat-rejection element of FIG. 4 includes a 6×4 array of heat-rejection elements;

FIG. 6 illustrates an example operational flow 600 implemented in a portable electronic device having a shell and heat-generating component;

FIG. 9 illustrates an example operational flow 900 implemented in a portable electronic device having an exterior shell and a heat-generating component;

FIG. 10 illustrates a portable electronic device having a system 1000 for limiting exterior temperatures encountered by a user of the portable electronic device;

FIG. 12 illustrates an example operational flow 1200 limiting exterior temperatures encountered by a user of a portable electronic device having an exterior shell and a heat generating component;

FIG. 13 illustrates an example system 1300 for limiting exterior temperatures encountered by a user of a portable electronic device;

FIG. 14 illustrates an example environment 1400 in which embodiments may be implemented;

FIG. 17 illustrates an example operational flow 1600 implemented in a portable electronic device having a shell and a heat-generating component.

DETAILED DESCRIPTION

Figure 1:
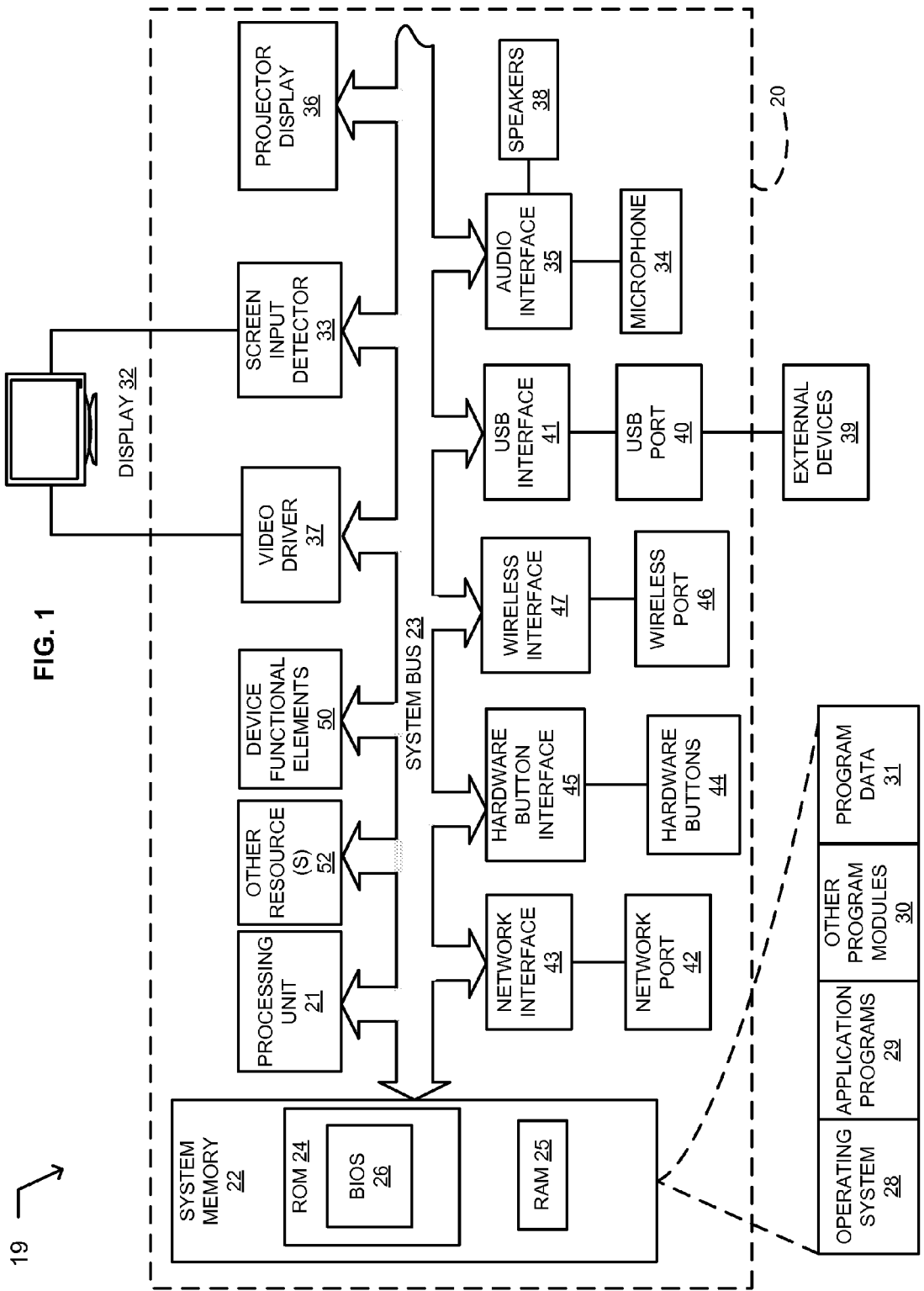
FIG. 1 illustrates an example embodiment of a thin computing device in which embodiments may be implemented.

In the following detailed description, reference is made to the accompanying drawings, which form a part hereof. In the drawings, similar symbols typically identify similar components, unless context dictates otherwise. The illustrated embodiments described in the detailed description, drawings, and claims are not meant to be limiting. Other embodiments may be utilized, and other changes may be made, without departing from the spirit or scope of the subject matter presented here.

Those having skill in the art will recognize that the state of the art has progressed to the point where there is little distinction left between hardware, software, and/or firmware implementations of aspects of systems; the use of hardware, software, and/or firmware is generally (but not always, in that in certain contexts the choice between hardware and software can become significant) a design choice representing cost vs. efficiency tradeoffs. Those having skill in the art will appreciate that there are various implementations by which processes and/or systems and/or other technologies described herein can be effected (e.g., hardware, software, and/or firmware), and that the preferred implementation will vary with the context in which the processes and/or systems and/or other technologies are deployed. For example, if an implementer determines that speed and accuracy are paramount, the implementer may opt for a mainly hardware and/or firmware implementation; alternatively, if flexibility is paramount, the implementer may opt for a mainly software implementation; or, yet again alternatively, the implementer may opt for some combination of hardware, software, and/or firmware. Hence, there are several possible implementations by which the processes and/or devices and/or other technologies described herein may be effected, none of which is inherently superior to the other in that any implementation to be utilized is a choice dependent upon the context in which the implementation will be deployed and the specific concerns (e.g., speed, flexibility, or predictability) of the implementer, any of which may vary. Those skilled in the art will recognize that optical aspects of implementations will typically employ optically-oriented hardware, software, and or firmware.

In some implementations described herein, logic and similar implementations may include software or other control structures suitable to implement an operation. Electronic circuitry, for example, may manifest one or more paths of electrical current constructed and arranged to implement various logic functions as described herein. In some implementations, one or more media are configured to bear a device-detectable implementation if such media hold or transmit a special-purpose device instruction set operable to perform as described herein. In some variants, for example, this may manifest as an update or other modification of existing software or firmware, or of gate arrays or other programmable hardware, such as by performing a reception of or a transmission of one or more instructions in relation to one or more operations described herein. Alternatively or additionally, in some variants, an implementation may include special-purpose hardware, software, firmware components, and/or general-purpose components executing or otherwise invoking special-purpose components. Specifications or other implementations may be transmitted by one or more instances of tangible transmission media as described herein, optionally by packet transmission or otherwise by passing through distributed media at various times.

Alternatively or additionally, implementations may include executing a special-purpose instruction sequence or otherwise invoking circuitry for enabling, triggering, coordinating, requesting, or otherwise causing one or more occurrences of any functional operations described below. In some variants, operational or other logical descriptions herein may be expressed directly as source code and compiled or otherwise invoked as an executable instruction sequence. In some contexts, for example, C++ or other code sequences can be compiled directly or otherwise implemented in high-level descriptor languages (e.g., a logic-synthesizable language, a hardware description language, a hardware design simulation, and/or other such similar mode(s) of expression). Alternatively or additionally, some or all of the logical expression may be manifested as a Verilog-type hardware description or other circuitry model before physical implementation in hardware, especially for basic operations or timing-critical applications. Those skilled in the art will recognize how to obtain, configure, and optimize suitable transmission or computational elements, material supplies, actuators, or other common structures in light of these teachings.

In a general sense, those skilled in the art will recognize that the various embodiments described herein can be implemented, individually and/or collectively, by various types of electro-mechanical systems having a wide range of electrical components such as hardware, software, firmware, and/or virtually any combination thereof and a wide range of components that may impart mechanical force or motion such as rigid bodies, spring or torsional bodies, hydraulics, electro-magnetically actuated devices, and/or virtually any combination thereof. Consequently, as used herein "electro-mechanical system" includes, but is not limited to, electrical circuitry operably coupled with a transducer (e.g., an actuator, a motor, a piezoelectric crystal, a Micro Electro Mechanical System (MEMS), etc.), electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), electrical circuitry forming a communications device (e.g., a modem, module, communications switch, optical-electrical equipment, etc.), and/or any non-electrical analog thereto, such as optical or other analogs. Those skilled in the art will also appreciate that examples of electro-mechanical systems include but are not limited to a variety of consumer electronics systems, medical devices, as well as other systems such as motorized transport systems, factory automation systems, security systems, and/or communication/computing systems. Those skilled in the art will recognize that electro-mechanical as used herein is not necessarily limited to a system that has both electrical and mechanical actuation except as context may dictate otherwise.

In a general sense, those skilled in the art will also recognize that the various aspects described herein which can be implemented, individually and/or collectively, by a wide range of hardware, software, firmware, and/or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), and/or electrical circuitry forming a communications device (e.g., a modem, communications switch, optical-electrical equipment, etc.). Those having skill in the art will recognize that the subject matter described herein may be implemented in an analog or digital fashion or some combination thereof.

Those skilled in the art will further recognize that at least a portion of the devices and/or processes described herein can be integrated into an image processing system. A typical image processing system may generally include one or more of a system unit housing, a video display device, memory such as volatile or non-volatile memory, processors such as microprocessors or digital signal processors, computational entities such as operating systems, drivers, applications programs, one or more interaction devices (e.g., a touch pad, a touch-sensitive screen or display surface, an antenna, etc.), control systems including feedback loops and control motors (e.g., feedback for sensing lens position and/or velocity; control motors for moving/distorting lenses to give desired focuses). An image processing system may be implemented utilizing suitable commercially available components, such as those typically found in digital still systems and/or digital motion systems.

Those skilled in the art will likewise recognize that at least some of the devices and/or processes described herein can be integrated into a data processing system. Those having skill in the art will recognize that a data processing system generally includes one or more of a system unit housing, a video display device, memory such as volatile or non-volatile memory, processors such as microprocessors or digital signal processors, computational entities such as operating systems, drivers, graphical user interfaces, and applications programs, one or more interaction devices (e.g., a touch pad, a touch-sensitive screen or display surface, an antenna, etc.), and/or control systems including feedback loops and control motors (e.g., feedback for sensing position and/or velocity; control motors for moving and/or adjusting components and/or quantities). A data processing system may be implemented utilizing suitable commercially available components, such as those typically found in data computing/communication and/or network computing/communication systems.

Figure 2:
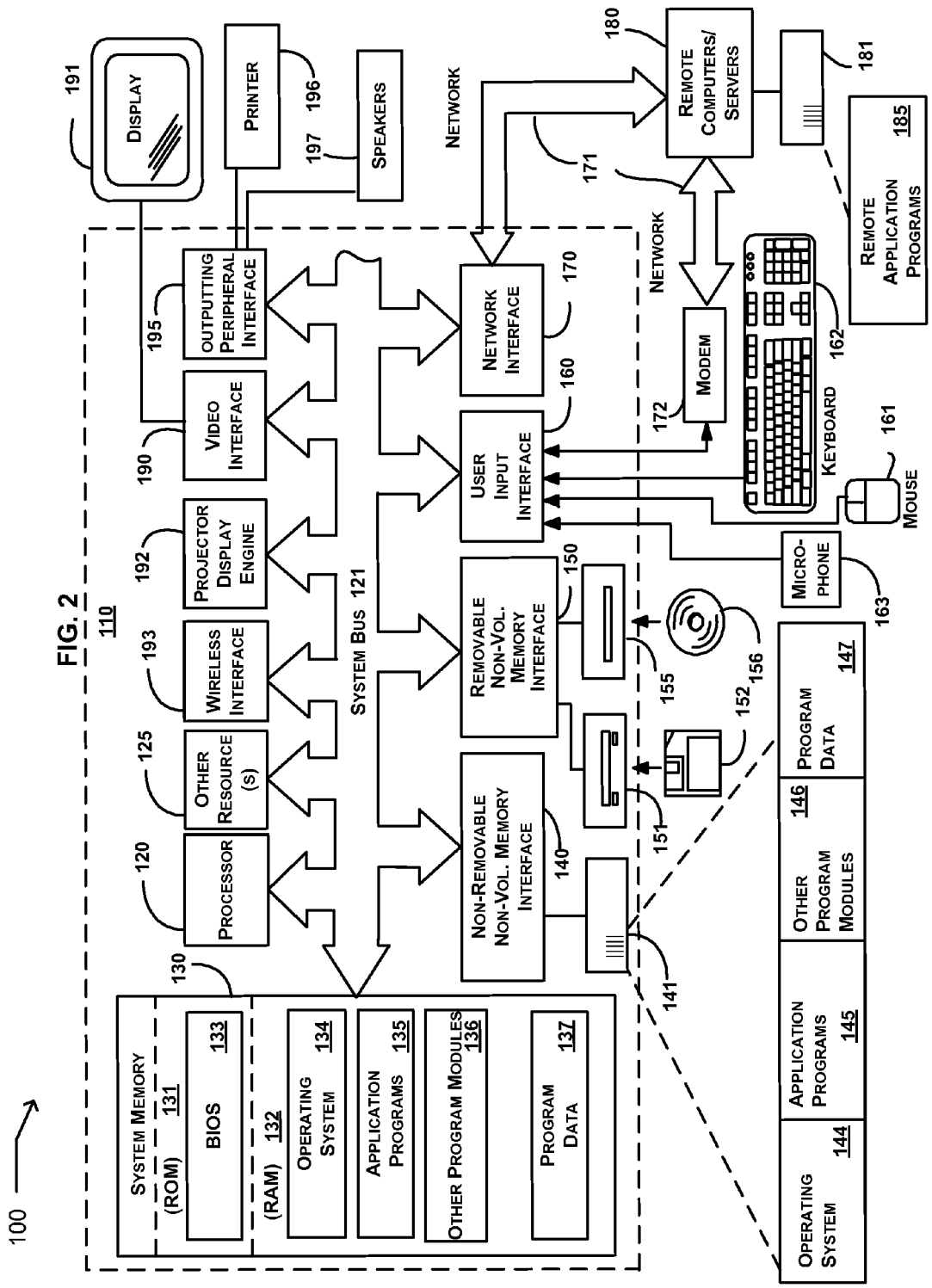
FIG. 2 illustrates an example embodiment of a general-purpose computing system in which embodiments may be implemented.

FIGS. 1 and 2 provide respective general descriptions of several environments in which implementations may be implemented. FIG. 1 is generally directed toward a thin computing environment 19 having a thin computing device 20, and FIG. 2 is generally directed toward a general purpose computing environment 100 having general purpose computing device 110. However, as prices of computer components drop and as capacity and speeds increase, there is not always a bright line between a thin computing device and a general purpose computing device. Further, there is a continuous stream of new ideas and applications for environments benefited by use of computing power. As a result, nothing should be construed to limit disclosed subject matter herein to a specific computing environment unless limited by express language.

FIG. 1 and the following discussion are intended to provide a brief, general description of a thin computing environment 19 in which embodiments may be implemented. FIG. 1 illustrates an example system that includes a thin computing device 20, which may be included or embedded in an electronic device that also includes a device functional element 50. For example, the electronic device may include any item having electrical or electronic components playing a role in a functionality of the item, such as for example, a refrigerator, a car, a digital image acquisition device, a camera, a cable modem, a printer an ultrasound device, an x-ray machine, a non-invasive imaging device, or an airplane. For example, the electronic device may include any item that interfaces with or controls a functional element of the item. In another example, the thin computing device may be included in an implantable medical apparatus or device. In a further example, the thin computing device may be operable to communicate with an implantable or implanted medical apparatus. For example, a thin computing device may include a computing device having limited resources or limited processing capability, such as a limited resource computing device, a wireless communication device, a mobile wireless communication device, a smart phone, an electronic pen, a handheld electronic writing device, a scanner, a cell phone, a smart phone (such as an Android® or iPhone® based device), a tablet device (such as an iPad®) or a Blackberry® device. For example, a thin computing device may include a thin client device or a mobile thin client device, such as a smart phone, tablet, notebook, or desktop hardware configured to function in a virtualized environment.

The thin computing device 20 includes a processing unit 21, a system memory 22, and a system bus 23 that couples various system components including the system memory 22 to the processing unit 21. The system bus 23 may be any of several types of bus structures including a memory bus or memory controller, a peripheral bus, and a local bus using any of a variety of bus architectures. The system memory includes read-only memory (ROM) 24 and random access memory (RAM) 25. A basic input/output system (BIOS) 26, containing the basic routines that help to transfer information between sub-components within the thin computing device 20, such as during start-up, is stored in the ROM 24. A number of program modules may be stored in the ROM 24 or RAM 25, including an operating system 28, one or more application programs 29, other program modules 30, and program data 31.

A user may enter commands and information into the computing device 20 through one or more input interfaces. An input interface may include a touch-sensitive screen or display surface, or one or more switches or buttons with suitable input detection circuitry. A touch-sensitive screen or display surface is illustrated as a touch-sensitive display 32 and screen input detector 33. One or more switches or buttons are illustrated as hardware buttons 44 connected to the system via a hardware button interface 45. The output circuitry of the touch-sensitive display 32 is connected to the system bus 23 via a video driver 37. Other input devices may include a microphone 34 connected through a suitable audio interface 35, or a physical hardware keyboard (not shown). Output devices may include the display 32, or a projector display 36.

In addition to the display 32, the computing device 20 may include other peripheral output devices, such as at least one speaker 38. Other external input or output devices 39, such as a joystick, game pad, satellite dish, scanner or the like may be connected to the processing unit 21 through a USB port 40 and USB port interface 41, to the system bus 23. Alternatively, the other external input and output devices 39 may be connected by other interfaces, such as a parallel port, game port or other port. The computing device 20 may further include or be capable of connecting to a flash card memory (not shown) through an appropriate connection port (not shown). The computing device 20 may further include or be capable of connecting with a network through a network port 42 and network interface 43, and through wireless port 46 and corresponding wireless interface 47 may be provided to facilitate communication with other peripheral devices, including other computers, printers, and so on (not shown). It will be appreciated that the various components and connections shown are examples and other components and means of establishing communication links may be used.

The computing device 20 may be primarily designed to include a user interface. The user interface may include a character, a key-based, or another user data input via the touch sensitive display 32. The user interface may include using a stylus (not shown). Moreover, the user interface is not limited to an actual touch-sensitive panel arranged for directly receiving input, but may alternatively or in addition respond to another input device such as the microphone 34. For example, spoken words may be received at the microphone 34 and recognized. Alternatively, the computing device 20 may be designed to include a user interface having a physical keyboard (not shown).

The device functional elements 50 are typically application specific and related to a function of the electronic device, and are coupled with the system bus 23 through an interface (not shown). The functional elements may typically perform a single well-defined task with little or no user configuration or setup, such as a refrigerator keeping food cold, a cell phone connecting with an appropriate tower and transceiving voice or data information, a camera capturing and saving an image, or communicating with an implantable medical apparatus.

In certain instances, one or more elements of the thin computing device 20 may be deemed not necessary and omitted. In other instances, one or more other elements may be deemed necessary and added to the thin computing device.

FIG. 2 and the following discussion are intended to provide a brief, general description of an environment in which embodiments may be implemented. FIG. 2 illustrates an example embodiment of a general-purpose computing system in which embodiments may be implemented, shown as a computing system environment 100. Components of the computing system environment 100 may include, but are not limited to, a general purpose computing device 110 having a processor 120, a system memory 130, and a system bus 121 that couples various system components including the system memory to the processor 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, also known as Mezzanine bus.

The computing system environment 100 typically includes a variety of computer-readable media products. Computer-readable media may include any media that can be accessed by the computing device 110 and include both volatile and nonvolatile media, removable and non-removable media. By way of example, and not of limitation, computer-readable media may include computer storage media. By way of further example, and not of limitation, computer-readable media may include a communication media.

Computer storage media includes volatile and nonvolatile, removable and non-removable media implemented in any method or technology for storage of information such as computer-readable instructions, data structures, program modules, or other data. Computer storage media includes, but is not limited to, random-access memory (RAM), read-only memory (ROM), electrically erasable programmable read-only memory (EEPROM), flash memory, or other memory technology, CD-ROM, digital versatile disks (DVD), or other optical disk storage, magnetic cassettes, magnetic tape, magnetic disk storage, or other magnetic storage devices, or any other medium which can be used to store the desired information and which can be accessed by the computing device 110. In a further embodiment, a computer storage media may include a group of computer storage media devices. In another embodiment, a computer storage media may include an information store. In another embodiment, an information store may include a quantum memory, a photonic quantum memory, or atomic quantum memory. Combinations of any of the above may also be included within the scope of computer-readable media.

Communication media may typically embody computer-readable instructions, data structures, program modules, or other data in a modulated data signal such as a carrier wave or other transport mechanism and include any information delivery media. The term "modulated data signal" means a signal that has one or more of its characteristics set or changed in such a manner as to encode information in the signal. By way of example, and not limitation, communications media may include wired media, such as a wired network and a direct-wired connection, and wireless media such as acoustic, RF, optical, and infrared media.

The system memory 130 includes computer storage media in the form of volatile and nonvolatile memory such as ROM 131 and RAM 132. A RAM may include at least one of a DRAM, an EDO DRAM, a SDRAM, a RDRAM, a VRAM, or a DDR DRAM. A basic input/output system (BIOS) 133, containing the basic routines that help to transfer information between elements within the computing device 110, such as during start-up, is typically stored in ROM 131. RAM 132 typically contains data and program modules that are immediately accessible to or presently being operated on by the processor 120. By way of example, and not limitation, FIG. 2 illustrates an operating system 134, application programs 135, other program modules 136, and program data 137. Often, the operating system 134 offers services to applications programs 135 by way of one or more application programming interfaces (APIs) (not shown). Because the operating system 134 incorporates these services, developers of applications programs 135 need not redevelop code to use the services. Examples of APIs provided by operating systems such as Microsoft's "WINDOWS" ® are well known in the art.

The computing device 110 may also include other removable/non-removable, volatile/nonvolatile computer storage media products. By way of example only, FIG. 2 illustrates a non-removable non-volatile memory interface (hard disk interface) 140 that reads from and writes for example to non-removable, non-volatile magnetic media. FIG. 2 also illustrates a removable non-volatile memory interface 150 that, for example, is coupled to a magnetic disk drive 151 that reads from and writes to a removable, non-volatile magnetic disk 152, or is coupled to an optical disk drive 155 that reads from and writes to a removable, non-volatile optical disk 156, such as a CD ROM. Other removable/non-removable, volatile/non-volatile computer storage media that can be used in the example operating environment include, but are not limited to, magnetic tape cassettes, memory cards, flash memory cards, DVDs, digital video tape, solid state RAM, and solid state ROM. The hard disk drive 141 is typically connected to the system bus 121 through a non-removable memory interface, such as the interface 140, and magnetic disk drive 151 and optical disk drive 155 are typically connected to the system bus 121 by a removable non-volatile memory interface, such as interface 150.

The drives and their associated computer storage media discussed above and illustrated in FIG. 2 provide storage of computer-readable instructions, data structures, program modules, and other data for the computing device 110. In FIG. 2, for example, hard disk drive 141 is illustrated as storing an operating system 144, application programs 145, other program modules 146, and program data 147. Note that these components can either be the same as or different from the operating system 134, application programs 135, other program modules 136, and program data 137. The operating system 144, application programs 145, other program modules 146, and program data 147 are given different numbers here to illustrate that, at a minimum, they are different copies.

A user may enter commands and information into the computing device 110 through input devices such as a microphone 163, keyboard 162, and pointing device 161, commonly referred to as a mouse, trackball, or touch pad. Other input devices (not shown) may include at least one of a touch-sensitive screen or display surface, joystick, game pad, satellite dish, and scanner. These and other input devices are often connected to the processor 120 through a user input interface 160 that is coupled to the system bus, but may be connected by other interface and bus structures, such as a parallel port, game port, or a universal serial bus (USB).

A display 191, such as a monitor or other type of display device or surface may be connected to the system bus 121 via an interface, such as a video interface 190. A projector display engine 192 that includes a projecting element may be coupled to the system bus. In addition to the display, the computing device 110 may also include other peripheral output devices such as speakers 197 and printer 196, which may be connected through an output peripheral interface 195.

The computing system environment 100 may operate in a networked environment using logical connections to one or more remote computers, such as a remote computer 180. The remote computer 180 may be a personal computer, a server, a router, a network PC, a peer device, or other common network node, and typically includes many or all of the elements described above relative to the computing device 110, although only a memory storage device 181 has been illustrated in FIG. 2. The network logical connections depicted in FIG. 2 include a local area network (LAN) and a wide area network (WAN), and may also include other networks such as a personal area network (PAN) (not shown). Such networking environments are commonplace in offices, enterprise-wide computer networks, intranets, and the Internet.

When used in a networking environment, the computing system environment 100 is connected to the network 171 through a network interface, such as the network interface 170, the modem 172, or the wireless interface 193. The network may include a LAN network environment, or a WAN network environment, such as the Internet. In a networked environment, program modules depicted relative to the computing device 110, or portions thereof, may be stored in a remote memory storage device. By way of example, and not limitation, FIG. 2 illustrates remote application programs 185 as residing on memory storage device 181. It will be appreciated that the network connections shown are examples and other means of establishing a communication link between the computers may be used.

In certain instances, one or more elements of the computing device 110 may be deemed not necessary and omitted. In other instances, one or more other elements may be deemed necessary and added to the computing device.

Figure 3:
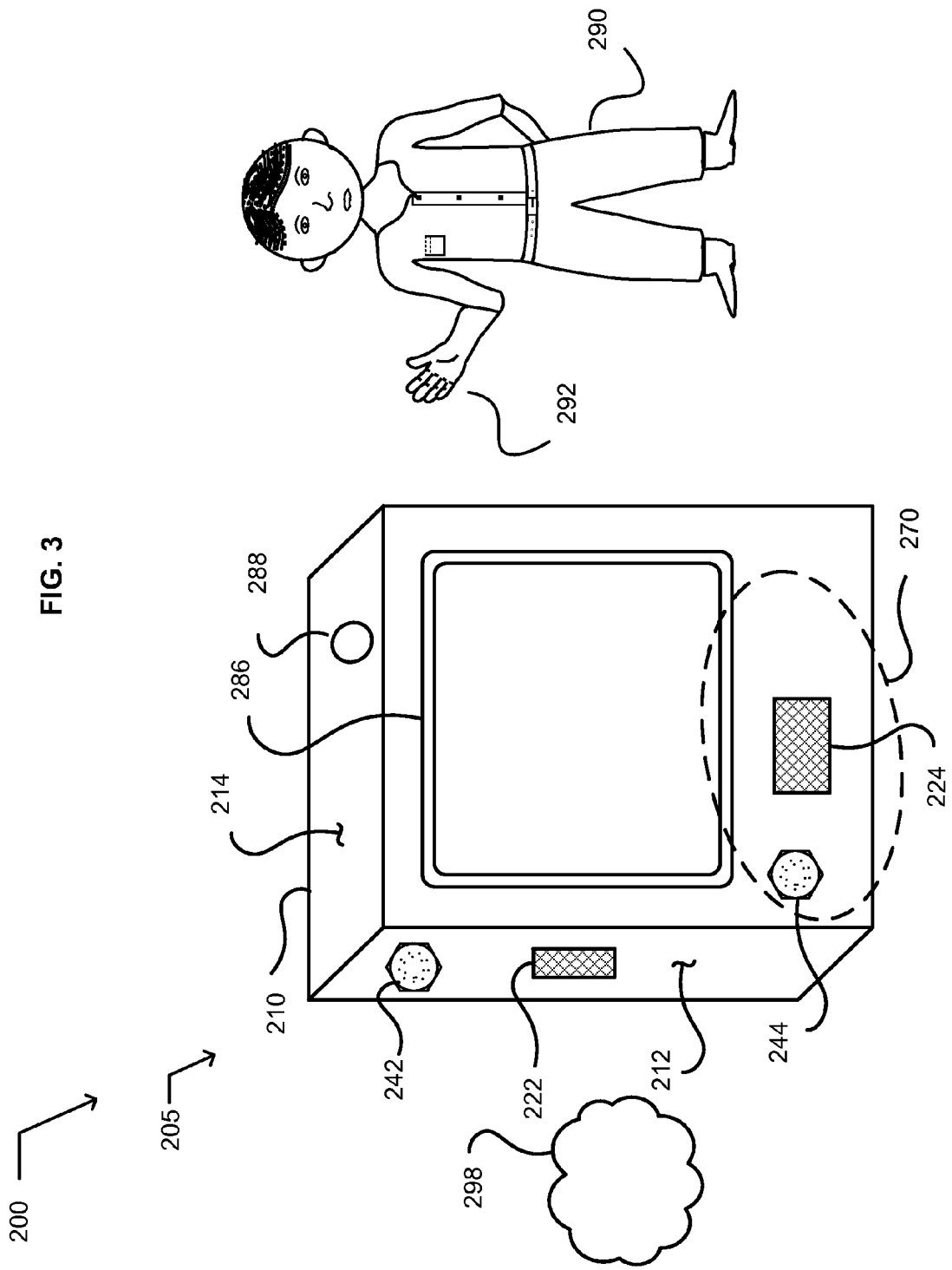
FIG. 3 illustrates an example environment 200 in which embodiments may be implemented.
Figure 4:
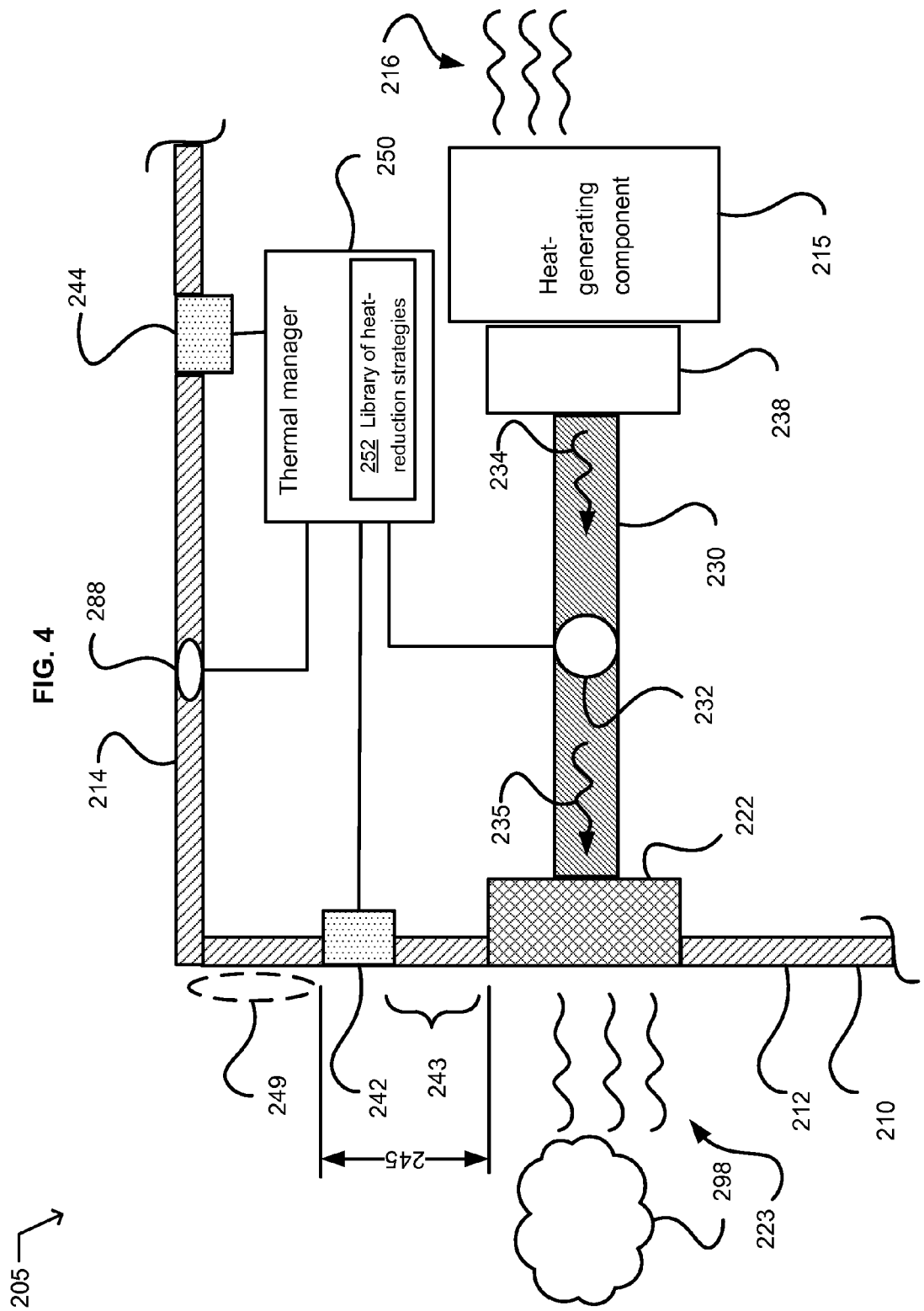
FIG. 4 further illustrates a schematic view of the embodiment of the portable electronic device of FIG. 3.

FIG. 3 illustrates an example environment 200 in which embodiments may be implemented. The environment includes an embodiment of a portable electronic device 205, and a user of the portable electronic device, illustrated as a person 290 having a hand 292 capable of touching, holding, or contacting the electronic device. FIG. 4 further illustrates a schematic view of the embodiment of the portable electronic device of FIG. 3. This portion of the detailed description will employ both FIGS. 3 and 4 to describe the portable electronic device.

The portable electronic device 205 includes a shell 210 housing the components of portable electronic device, and a heat-generating component 215 generating heat 216. The portable electronic device includes a heat-rejection element 222 located at a first exterior surface 212 of the shell. The heat-rejecting 222 element is configured to reject heat 223 received from the heat-generating component 215 into an environment 298 in thermal contact with the heat-rejection element. In an embodiment, the environment 298 includes an external or ambient environment in thermal contact with the heat-rejection element. In an embodiment, the environment 298 includes an external or ambient environment in thermal contact with the heat-rejection element and the shell. The portable electronic device includes a controllable thermal coupler 230 configured to regulate heat transfer to the heat-rejection element. In an embodiment, the controllable thermal coupler includes a control element 232 configured to physically or mechanically accomplish the regulation of heat transfer, illustrated by heat 234 and heat 235 transferring or flowing from the heat-generating component to the heat-rejection element. The portable electronic device includes a first proximity sensor 242 configured to determine a location 245 of a user touch 249 to the shell relative to the location of the heat-rejection element. In an embodiment, the user touch 249 may involve the hand of the user (e.g., fingers, palm). In an embodiment, the user touch 249 may involve other portions of the user's body or clothing (e.g., when the device is held on a lap, or is inside a pocket). The first proximity sensor has a proximity 243 to the heat-rejection element. The portable electronic device includes a thermal manager 250 configured to regulate heat transfer 235 by the controllable thermal coupler to the heat-rejection element in response to the determined location of the user touch relative to the location of the heat-rejection element. In an embodiment, the thermal manager may be implemented using electronic circuitry, a special-purpose device, electro-mechanical device or system, or control structure suitable to implement the described configuration or operability. Alternatively or additionally, in some variants of the thermal manager, an implementation may include special-purpose hardware, software, firmware components, and/or general-purpose components executing or otherwise invoking special-purpose components. In an embodiment, the portable electronic device includes a second exterior surface 214.

For example, in use, heat transfer 235 to the heat-rejection element 222 is controlled by or turned off by the controllable thermal coupler 230 in response to the location of the user touch 249 being close to or within a zone 270 of possible heat discomfort relative of the heat-rejection element. This is anticipated to limit user exposure to a hot or uncomfortably warm heat-rejection element. What is too close or within a zone of possible heat discomfort relative of the heat-rejection element is expected to vary depending on the configuration or features of the particular portable electronic device 205, and possibly the user. In the example illustrated by FIG. 4, the user touch is on the same side 212 of the portable electronic device as the heat-rejection element. This may be determined by the thermal manager 250 as too close to the heat-rejection element based on the configuration or features of the particular portable electronic device, and accordingly heat transfer to the heat-rejection element reduced or terminated. For example, in use, heat transfer to the heat-rejection element is initiated or continued by controllable thermal coupler in response to the location of the user touch being distant from or outside a zone of possible heat discomfort relative from the heat-rejection element. This is anticipated to provide heat rejection and allow cooling of the portable electronic device without burning or causing heat discomfort.

In an embodiment, the portable electronic device 205 may be implemented using the thin computing device 20 described in conjunction with FIG. 1. In an embodiment, the portable electronic device may be implemented using the general computing device 110 described in conjunction with FIG. 2. In an embodiment, the portable electronic device includes a cell phone or a smart phone. In an embodiment, the portable electronic device includes a tablet, laptop computer, or music player. In an embodiment, the shell 210 includes a hand-holdable shell. In an embodiment, the shell includes a cover substantially enclosing the portable electronic device having the heat-generating component. In an embodiment, the shell includes a cover that in combination with a display screen 286 that at least substantially encloses a portable electronic device having a heat-generating component. In an embodiment, the heat-generating component 215 includes a CPU. In an embodiment, the heat-generating component includes a battery. In an embodiment, the heat-generating component creates a variable or varying heat output during an operational cycle.

In an embodiment, the heat-rejection element 222 is disposed on or occupies an exterior portion of the shell 210. In an embodiment, the heat-rejection element is disposed on or occupies an exterior portion of the shell at a first location. In an embodiment, the heat-rejection element includes an opening through the shell which is exposed to an external or ambient environment in thermal contact with the shell. In an embodiment, the heat-rejection element is integrated with an exterior portion of the shell. In an embodiment, the heat-rejection element is configured to reject heat received from the heat-generating component into ambient air environment 298 in thermal contact with the shell. For example, an ambient air environment may include air surrounding or proximate to the shell. In an embodiment, the portable electronic device includes another heat-rejection element 224.

In an embodiment, the heat-rejection element 222 is configured to reject heat received from the heat-generating component 215 into a heat sinkable external object in thermal contact with the shell 210. For example, a heat sinkable external object may include a table top, counter top, or dashboard. FIG. 5 illustrates an embodiment where the heat-rejection element 222 of FIG. 4 includes a 6×4 array of heat-rejection elements 226. Heat transfer to at least two heat-rejection elements of the array of heat-rejection elements is separately controllable by the controllable thermal coupler 230. For example, the array may be located on a backside of the portable computing device 205. FIG. 5A illustrates an embodiment where all of the heat-rejection elements of the array are receiving heat 235 from the heat-rejecting component 215 and rejecting the received heat into the environment 298. For example, FIG. 5B illustrates a user touch 249 to a portion of the surface area occupied by four heat-rejection elements of the array. In this example, the thermal manager 250 is configured to operate the controllable thermal coupler 230 to reduce or terminate heat transfer to the four heat-rejection elements of the array 249, illustrated by the four blackened heat-rejection elements in FIG. 5B. In an embodiment, at least two heat-rejection elements of the array of heat-rejection elements are separately controllable by the controllable thermal coupler. In an embodiment, at least two heat-rejection elements of the array of heat-rejection elements are separately controllable by the controllable thermal coupler.

In an embodiment, the controllable thermal coupler 230 is configured to separately transfer heat 235 to a plurality of different spatial locations of the heat-rejection element 222. For example, the heat-rejection element may include a condenser portion of a heat pipe or heat plate running substantially parallel to a portion of shell and interior of the shell. The heat-rejection element includes a plurality of controllable thermal contacts disposed along the length or area of the heat pipe and configured to be separately controlled in response to the determined location of the user touch relative to the heat-rejection element. For example, this embodiment may be located on a back portion of the shell.

Returning to FIGS. 3 and 4, in an embodiment, the heat-rejection element 222 includes a piezoelectric fan assembly. An example of a piezoelectric fan assembly is described in U.S. Pat. App. No. 20040253130 (I. Sauciuc, et al.). In an embodiment, the heat-rejection element includes controllable fin assembly. For example, the controllable fin assembly may include fins having a controllable orientation or extension. In an embodiment, the controllable thermal coupler 230 includes a controllable microchannel heat exchanger having a heat-rejection element. In an embodiment, the controllable microchannel heat exchanger includes a microchanneled heat sink having a control valve configured to regulate flow of a working fluid through the microchannels. An example of a controllable microchannel heat exchanger is described in in U.S. Pat. App. No. 20050117300 (R. Prasher, et al.).

In an embodiment, the controllable thermal coupler 230 includes a controllable pump or valve, illustrated by the control element 232, configured to regulate transfer of a working fluid flowing between a heat-collecting element 238 and the heat-rejection element 222. In an embodiment, the controllable thermal coupler includes a controllable thermal contact, illustrated by the control element 232, between the heat-rejection element and the heat-generating component. In an embodiment, the controllable thermal contact comprises a repositionable thermally conductive solid. In an embodiment, the controllable thermal contact comprises a repositionable thermally conductive fluid. In an embodiment, the controllable thermal contact comprises a repositionable phase change material. In an embodiment, the controllable thermal contact includes a controllable mechanical contact, illustrated by the control element 232, between the heat-rejection element and the heat-generating component. For example, the controllable mechanical contact may include a spring, a bimorph, or a piezoelectric activated bridging device. For example, the controllable thermal contact may include a bridging fluid. In an embodiment, the controllable thermal coupler is further configured to control flow of a working fluid through the heat-rejection element. In an embodiment, the controllable thermal coupler is further configured to insert into or remove a working fluid from the heat-rejection element. In an embodiment, the controllable thermal coupler is further configured to control a thermally conductive physical contact between the heat-rejection element and the heat-generating component. In an embodiment, the controllable thermal coupler includes a controllable pump or valve configured to regulate transfer of a flowing working fluid. In an embodiment, the heat-rejection element is a component of the controllable thermal coupler.

In an embodiment, the controllable thermal coupler 230 further includes a heat-collecting element 238 configured to absorb heat 216 generated by the heat-generating component 215. In an embodiment, the controllable thermal coupler includes a controllable pump or valve, illustrated by the control element 232, configured to regulate transfer of a working fluid flowing between the heat-collecting element and the heat-rejection element. In an embodiment, the controllable thermal contact comprises a repositionable thermally conductive solid. In an embodiment, the controllable thermal contact comprises a repositionable thermally conductive fluid. In an embodiment, the controllable thermal contact comprises a repositionable phase change material. In an embodiment, the controllable thermal coupler includes a controllable thermal contact between the heat-rejection element and the heat-collecting element. In an embodiment, the controllable thermal coupler includes a controllable mechanical contact between the heat-rejection element and the heat-collecting element. In an embodiment, wherein the controllable thermal coupler is further configured to control a flow of a working fluid between the heat-rejection element and the heat-collecting element. In an embodiment, the controllable thermal coupler is further configured to control a thermally conductive physical contact between the heat-rejection element and the heat-collecting element. In an embodiment, the controllable thermal coupler includes a controllable thermal contact between the heat-generating component and the heat-collecting element. In an embodiment, the controllable thermal contact comprises a repositionable thermally conductive solid. In an embodiment, the controllable thermal contact comprises a repositionable thermally conductive fluid. In an embodiment, the controllable thermal contact comprises a repositionable phase change material. In an embodiment, the controllable thermal coupler includes a controllable mechanical contact between the heat-generating component and the heat-collecting element. In an embodiment, the controllable thermal coupler is further configured to control a flow of a working fluid between the heat-generating component and the heat-collecting element. In an embodiment, the controllable thermal coupler is further configured to control a thermally conductive physical contact between the heat-generating component and the heat-collecting element.

In an embodiment, the controllable thermal coupler 230 includes a working fluid control portion of a controllable heat pipe or heat plate positioned between an evaporator portion, illustrated as by the heat-collecting element 238, and a condenser portion, illustrated by the heat-rejection element 222. For example, the control element 232 may include a valve, switch, diverter, or baffle.

In an embodiment, the proximity sensor 242 is configured to determine a location of a user touch 249 on the shell 210 relative 245 to the location of the heat-rejection element 222. In an embodiment, the proximity sensor is configured to determine if a location of a user touch to the shell relative to the location of the heat-rejection element is within a zone 270 of possible heat discomfort. In an embodiment, the proximity sensor is configured to determine a location of a user touch to the shell relative to the location of the heat-rejection element. In an embodiment, the proximity sensor is configured to determine a distance between a user touch on the shell and the heat-rejection element. In an embodiment, the proximity sensor is located on or within the shell. In an embodiment, the proximity sensor is located on or within a portion of the shell that is a distance 245 of less than about 25 mm from the location of the heat-rejection element on the shell. In an embodiment, the distance is less than about 10 mm. In an embodiment, the proximity sensor is configured to determine a location and duration of a user touch to the shell relative to the location of the heat-rejection element. In an embodiment, the proximity sensor includes an ultrasound based proximity sensor. In an embodiment, the proximity sensor includes a radiofrequency (RF) based proximity sensor. A radiofrequency based proximity sensor may include radar, such as a micro-impulse radar. A radiofrequency based proximity sensor may comprise a dielectric scattering sensor, e.g., determining user proximity based on changes to an RF antenna's performance due to the dielectric properties of the user's body. In an embodiment, the proximity sensor includes a contact sensor located at an exterior surface of the shell. In an embodiment, the proximity sensor includes an image sensor. In an embodiment, the proximity sensor includes a temperature sensor. In an embodiment, the proximity sensor includes an electrical conductivity sensor. For example, an electrical conductivity sensor may include a pair of electrical contacts configured to be conductively bridged by contact with a fingertip or body part. In an embodiment, the proximity sensor includes a capacitive touch sensor. For example, one or more capacitive touch sensors may be located over the shell of a cell phone or tablet to have a chance of distinguishing a person's hand from a handbag or pocket. In an embodiment, the proximity sensor includes a reverse power sensor configured to detect a loading of a transmitting antenna of the portable electronic device by a body part of the user. For example, transmitters of portable electronic devices generally have a reverse power sensor already present for protection purposes. In an embodiment, the proximity sensor includes a thermal capacitor. A thermal capacitor would allow a transmitter of a portable electronic device to run at full power if a user is near the edge of the portable electronic device for a while before you had to drop the call because the surface was getting too hot. An example implementation is a paraffin wax with the right melting point impregnated in a porous metal matrix, inside of a metal can. In an embodiment, the proximity sensor includes a heat flux sensor proximate to or incorporated in the heat-rejection element. This is expected to discern between a proximity of a hand of the user, or the portable electronic device being placed in a pocket.

In an embodiment, the thermal manager 250 is configured to select from a library of heat reduction strategies 252 a heat rejection strategy at least partially based on the determined location of the user touch 249 relative 245 to the location of the heat-rejection element 222, and to regulate heat transfer by the controllable thermal coupler 230 to the heat-rejection element in response to the selected heat reduction strategy. In an embodiment, the thermal manager is configured to limit heat transfer by the controllable thermal coupler to the heat-rejection element in response to the determined location of the user touch. In an embodiment, the thermal manager is configured to limit heat transfer by the controllable thermal coupler to the heat-rejection element in response to a determination that the location of the user touch relative to the location of the heat-rejection element is within a zone 270 of possible heat discomfort. In an embodiment, the thermal manager is configured to limit heat discharged 223 by the heat-rejection element to a predetermined temperature in response to the determined location of the user touch relative to the location of the heat-rejection element. In an embodiment, the thermal manager is configured to limit heat discharged 223 by the heat-rejection element to a predetermined air temperature in response to the determined location of the user touch relative to the location of the heat-rejection element. For example, this embodiment may be implemented by limiting a temperature of the controllable heat-rejection element within a zone of possible heat discomfort relative to the determined location of user touch. For example, the limiting a temperature may include limiting a temperature of an exterior surface of the heat-rejection element or limiting a temperature of air expelled. In an embodiment, the thermal manager is configured to limit a surface temperature of the heat-rejection element to a predetermined temperature in response to the determined location of the user touch relative to the heat-rejection element. In an embodiment, the predetermined temperature is a user tolerable temperature when the determined location of the user touch is within a zone of possible heat discomfort relative to the location of the heat-rejection element. For example, a user tolerable temperature may be 43° C. when the determined location of the user touch is about 25 mm from the location of the heat-rejection element. In an embodiment, the predetermined temperature is a user tolerable temperature based at least partially on a duration of the user touch within a zone of possible heat discomfort relative to the location of the heat-rejection element. For example, a user tolerable temperature may be less than about 47° C. when the duration of the user touch is about several seconds, less than about 45° C. when the duration of the user touch is between about three and five minutes, and less than about 43° C. when the duration of the user touch is more than about five minutes. In an embodiment, the predetermined temperature is limited to a thermal damage constraint of the electronic device if the determined location of the user touch is not within a zone of possible heat discomfort relative to the location of the heat-rejection element. For example, a thermal damage constraint of the electronic device may include a thermal limit of a plastic shell 210, or a thermal limit of the heat-generating component 215. In an embodiment, the portable electronic device further includes a temperature sensor 288 configured to determine a temperature of the shell or of the heat-rejection element 222. In an embodiment, the portable electronic device further includes another proximity sensor 244.

FIG. 6 illustrates an example operational flow 600 implemented in a portable electronic device having a shell and heat-generating component. After a start operation, the operational flow includes a touch location operation 610. The touch location operation includes determining a location of a user touch to the shell relative to a location of a heat-rejection element located at an exterior surface of the shell. The heat-rejection element is configured to reject heat received from a heat-generating component of the electronic device into an environment in thermal contact with the heat-rejection element. In an embodiment, the touch location operation may be implemented using the proximity sensor 242 described in conjunction with FIGS. 3 and 4. A choosing operation 620 includes selecting a heat rejection strategy responsive to the determined location of the user touch relative to the location of the heat-rejection element. The choosing operation may be implemented using the thermal manager 250, and optionally the library of heat-reduction strategies 252, described in conjunction with FIGS. 3 and 4. A control operation 630 includes regulating heat transfer from the heat-generating component to the heat-rejection element in accordance with the selected heat-rejection strategy. In an embodiment, the control operation may be implemented using the controllable thermal coupler 230 described in conjunction with FIGS. 3 and 4. The operational flow includes an end operation.

In an embodiment of the touch location operation 610, the determining includes determining a location and duration of a user touch to the shell relative to a location of a heat-rejection element located at an exterior surface of the shell. In an embodiment of the choosing operation 620, the selecting includes selecting a heat rejection strategy responsive to the determined location and a duration of the user touch relative to the location of the heat-rejection element. For example, the heat rejection strategy may include reducing heat rejection during the duration of the user touch. In an embodiment of the touch location operation, the determining includes determining if a location of a user touch to the shell relative to a location of a heat-rejection element located at an exterior surface of the shell is within a zone of possible heat discomfort. In an embodiment of the choosing operation 620, the selecting includes selecting a heat rejection strategy decreasing heat rejection by the heat-rejection element if the determined location of the user touch relative to the location of the heat-rejection element is within a zone of possible heat discomfort. In an embodiment, the zone of possible heat discomfort relative to the location of the heat-rejection element is less than about 25 mm. In an embodiment, the zone of possible heat discomfort relative to the location of the heat-rejection element is less than about 15 mm. In an embodiment, the zone of possible heat discomfort is in contact with the heat-rejection element.

In an embodiment of the choosing operation 620, the selecting includes selecting a heat rejection strategy increasing heat rejection by the heat-rejection element if the determined location of the user touch relative to the location of the heat-rejection element is not within a zone of possible heat discomfort. In an embodiment of the choosing operation, the selecting includes selecting a heat rejection strategy limiting a surface temperature of the heat-rejection element to a predetermined temperature if the determined location of the user touch relative to the location of the heat-rejection element is within a zone of possible heat discomfort. For example, the predetermined temperature may include a temperature determined or predicted to be a user tolerable temperature. For example, the predetermined temperature may include a user tolerable temperature.

Figure 7:
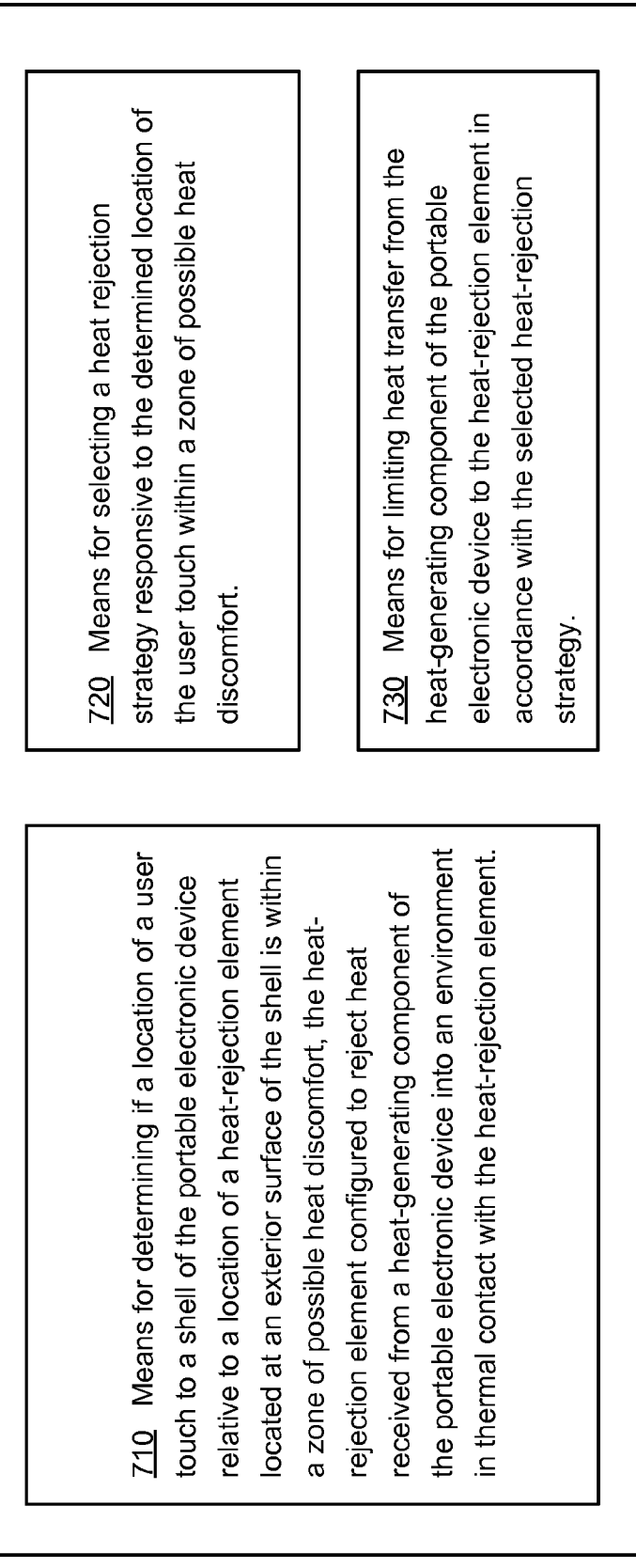
FIG. 7 illustrates a portable electronic device having a system 700 for limiting exterior temperatures encountered by a user of a portable electronic device.

FIG. 7 illustrates a portable electronic device having a system 700 for limiting exterior temperatures encountered by a user of a portable electronic device. The system includes means 710 for determining if a location of a user touch to a shell of the portable electronic device relative to a location of a heat-rejection element located at an exterior surface of the shell is within a zone of possible heat discomfort. The heat-rejection element is configured to reject heat received from a heat-generating component of the portable electronic device into an environment in thermal contact with the heat-rejection element. The system includes means 720 for selecting a heat rejection strategy responsive to the determined location of the user touch within a zone of possible heat discomfort. The system includes means 730 for limiting a heat transfer from the heat-generating component of the portable electronic device to the heat-rejection element in accordance with the selected heat-rejection strategy.

Figure 8:
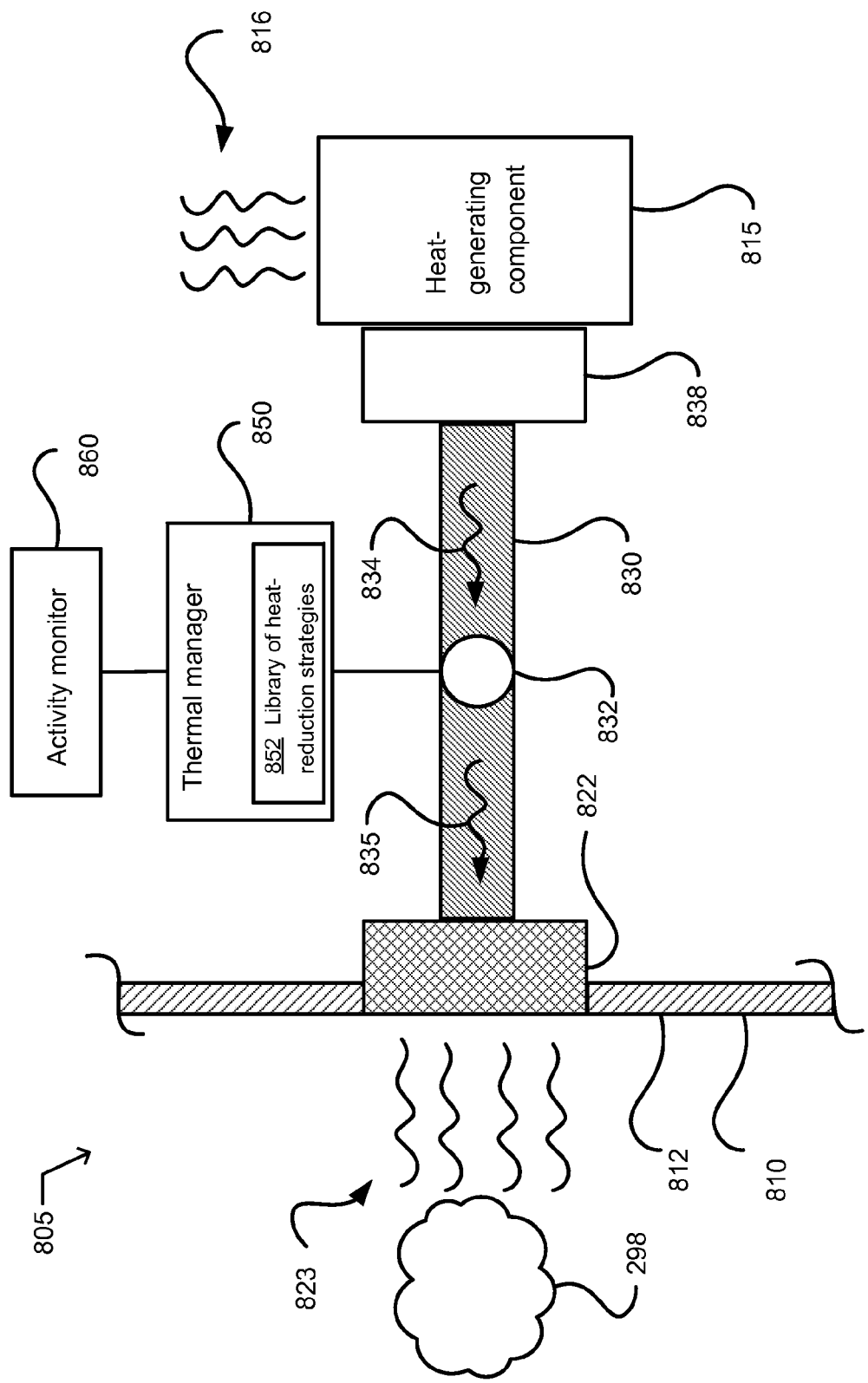
FIG. 8 illustrates an example portable electronic device 805 having system for limiting exterior temperatures encountered by a user of the portable electronic device.

FIG. 8 illustrates an example portable electronic device 805 having a system for limiting exterior temperatures encountered by a user of the portable electronic device. In an embodiment, the portable electronic device may be implemented in the example operating environment 200 described in conjunction with FIGS. 3 and 4. In an embodiment, the portable electronic device 805 may be implemented using the thin computing device 20 described in conjunction with FIG. 1. In an embodiment, the portable electronic device may be implemented using the general computing device 110 described in conjunction with FIG. 2. The portable electronic device includes a shell 810 housing components of the portable electronic device 805 and a heat-generating component 815 generating heat 816. In an embodiment, the shell includes a hand-holdable shell. The portable electronic device includes a heat-rejection element 822 located at an exterior surface 812 of the shell. The heat-rejection element is configured to reject heat 823 received from the heat-generating component into the environment 298 in thermal contact with the heat-rejection element. In an embodiment, the heat-rejection element is substantially similar to the heat-rejection element 222 described in conjunction with FIGS. 3 and 4. For example, the environment may include an ambient environment or an external environment in thermal contact with the heat-rejection element or the shell. The portable electronic device includes a controllable thermal coupler 830 configured to regulate heat transfer 834 and 835 to the heat-rejection element. In an embodiment, the controllable thermal coupler 830 configured to regulate heat transfer 834 and 835 between the heat collecting element 838 and the heat-rejection element.

In an embodiment, the controllable thermal coupler is substantially similar to the controllable thermal coupler 230 described in conjunction with FIGS. 3 and 4. The portable electronic device includes an activity monitor 860 configured to infer a user touch to the shell in response to a detected activity of the portable electronic device. In an embodiment, the detected activity may include an activity computationally detected or an activity detected by a motion or movement of the shell. For example, a computationally detected activity may include receiving a user inputted phone number, or a search request. The portable electronic device includes a thermal manager 850 configured to regulate heat transfer by the controllable thermal coupler 830 to the heat-rejection element in response to the inferred user touch. In an embodiment, the controllable thermal coupler includes a control element 832 configured to physically or mechanically accomplish the regulation of heat transfer, illustrated by heat 834 and heat 835 transferring or flowing from the heat-generating component to the heat-rejection element.

In an embodiment, the activity monitor 860 is further configured to infer a location of the user touch to the shell 810 in response to a detected activity of the portable electronic device 805. In an embodiment, the location of the user touch may be computationally detected or activity detected by a motion or movement of the shell. In an embodiment, the heat-rejection element 822 includes a heat-rejection element located at or incorporated in an exterior surface 812 of the shell 810. In an embodiment, the detected activity of the portable electronic device includes a detected user-initiated action executing on the portable electronic device. For example, a detected user-initiated action may include a cell phone function active, a browser active, displaying video content, or a touch screen or keyboard receiving user inputs. In an embodiment, the detected activity of the portable electronic device includes a detected spatial movement of the shell having a characteristic of a user-imparted movement. For example, a detected spatial movement may include a rotational or translational movement. For example, a detected spatial movement may include a movement characteristic of a hand holding the electronic device, a movement characteristic associated with the user viewing the device, or a movement characteristic associated with touch entries. For example, such characteristics may include dialing, or the portable electronic device remaining persisting in a substantially vertical or horizontal screen orientation. In an embodiment, the detected activity of the portable electronic device includes a detected aspect of a movement of the shell having a characteristic of a user-imparted movement, i.e. indicative of keyboard activity compared to watching a video. In an embodiment, the detected activity of the portable electronic device includes an accelerometer detected movement of the shell having a characteristic of a user-imparted movement, such as being held or resting on a lap. In an embodiment, the detected activity of the portable electronic device includes the portable electronic device being in a pocket mode state.

In an embodiment, the thermal manager 850 is configured to select from a library 852 of at least two heat-rejection strategies a heat rejection strategy responsive to an aspect of the inferred user touch. The thermal manager is further configured to regulate heat transfer (834-835) by the controllable thermal coupler 830 to the heat-rejection element 822 in response to the selected heat reduction strategy. For example, the library may include different strategies for regulating heat transfer for keyboard activity compared to watching a video. For example, the library may include strategies for preferentially rejecting heat to the back side of the portable electronic device not undergoing user-imparted movement.

FIG. 9 illustrates an example operational flow 900 implement in a portable electronic device having an exterior shell and a heat-generating component. After a start operation, the operational flow includes a deduction operation 910. The deduction operation includes inferring a user touch to the shell in response to a detected user-initiated or user-imparted activity of the portable electronic device. In an embodiment, the deduction operation may be implemented using the activity monitor 860 described in conjunction with FIG. 8. A control operation 920 includes regulating a heat transfer from a heat-generating component of the portable electronic device to a heat-rejection element located at an exterior surface of the shell in response to the inferred user touch, the heat-rejection element configured to reject heat into an environment external to the shell. In an embodiment, the control operation may be implemented using the thermal manager 850 described in conjunction with FIG. 8. The operational flow includes an end operation.

In an embodiment of the control operation 920, the regulating heat transfer includes limiting a heat transfer from a heat-generating component of the portable electronic device to a heat-rejection element located at an exterior surface of the shell in response to the inferred user touch. In an embodiment, the operational flow may include at least one additional operation, such as an operation 930. The operation 930 includes selecting a heat rejection strategy responsive to the inferred user touch to the shell. In an embodiment, the selecting includes selecting a heat rejection strategy responsive to a duration of the inferred user touch to the shell. In an embodiment, the control operation 920 includes at least one additional operation, such as an operation 922. The operation 922 includes regulating in accordance with the selected heat-rejection strategy a heat transfer from a heat-generating component of the portable electronic device to a heat-rejection element located at an exterior surface of the shell.

FIG. 10 illustrates a portable electronic device having a system 1000 for limiting exterior temperatures encountered by a user of the portable electronic device. The system includes means 1010 for inferring a user touch to the shell in response to a detected user-initiated or user-imparted activity of the portable electronic device. The system includes means 1020 for selecting a heat rejection strategy responsive to the inferred user touch to the shell. The system includes means 1030 for regulating in accordance with the selected heat-rejection strategy a heat transfer from a heat-generating component of the portable electronic device to a heat-rejection element located at an exterior surface of the shell.

Figure 11:
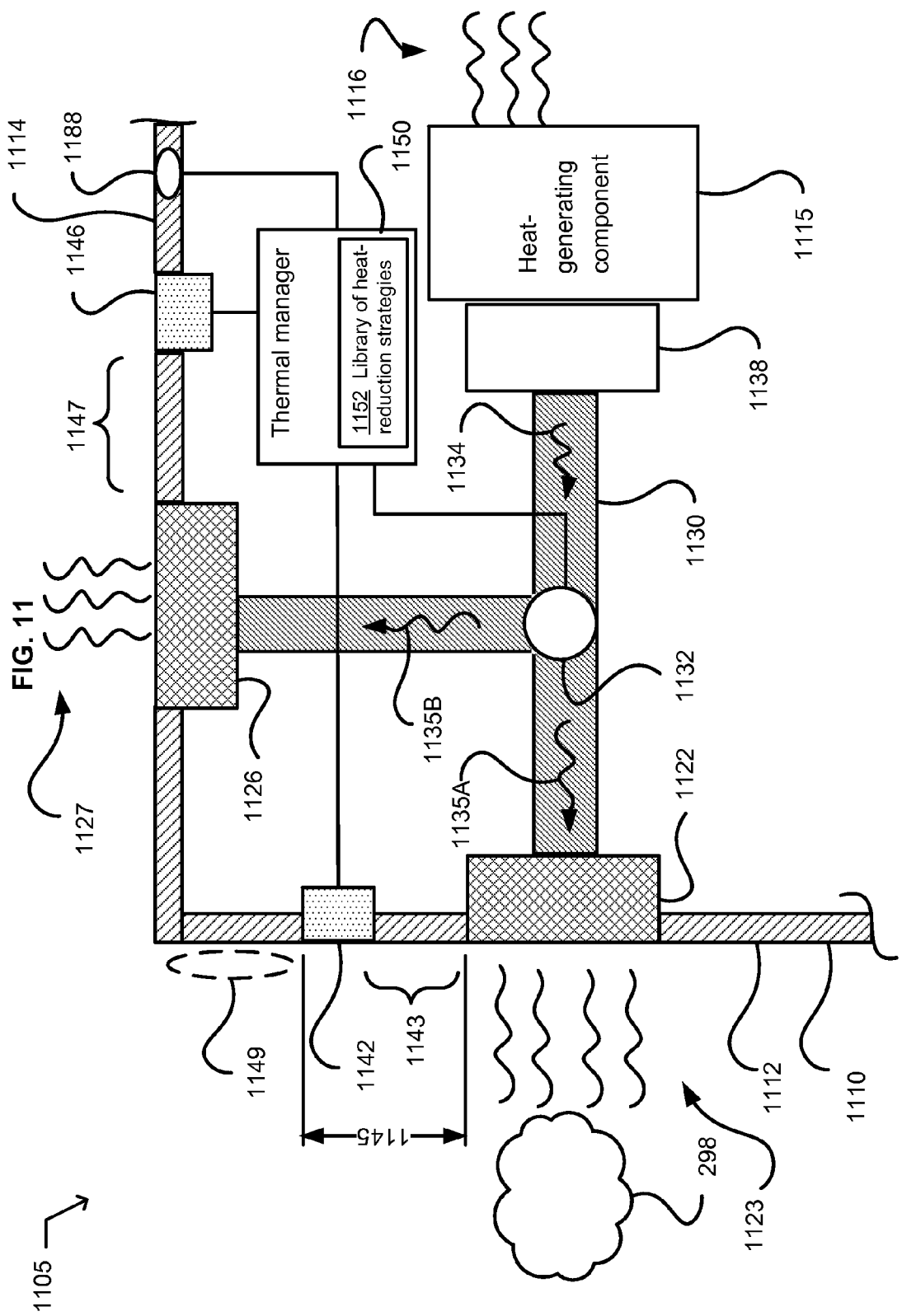
FIG. 11 illustrates a portable electronic device 1105.

FIG. 11 illustrates a portable electronic device 1105. The portable electronic device 1105 is an alternative version of the portable electronic device 205 operating in the environment 200 of FIGS. 3-5. The portable electronic device 1105 of FIG. 11 includes a shell 1110 housing the portable electronic device and a heat-generating component 1115 generating heat 1116. The portable electronic device includes a first heat-rejection element 1122 located at first exterior portion 1112 of the shell and a second heat-rejection element 1126 located at a second exterior portion 1114 of the shell. Each heat-rejection element is configured to reject heat 1123 and heat 1127 received from the heat-generating component into an environment 298 in thermal contact with the shell. The portable electronic device includes a controllable thermal coupler 1130 configured to regulate heat transfer to the first heat-rejection element and/or to the second heat-rejection element. In an embodiment, the controllable thermal coupler includes a control element 1132 configured to physically or mechanically accomplish the regulation of heat transfer, illustrated by heat 1134 and heat 1135 transferring or flowing from the heat-generating component to the heat-rejection elements. The portable electronic device includes a first proximity sensor 1142 configured to determine if a user touch 1149 to the shell is within a first zone of possible heat discomfort 270 (illustrated in FIG. 3) defined for the first heat-rejection element. The first proximity sensor has a first proximity 1143 to the first heat-rejection element. The portable electronic device includes a thermal manager 1150 configured to regulate heat transfer 1135A and 1135B by the controllable thermal coupler respectively to the first heat-rejection element and to second heat-rejection element. The regulated heat transfer includes adjusting heat rejection away from the first heat-rejection element and toward the second heat-rejection element if the user touch is determined to be within the first zone of possible heat discomfort.

In an embodiment, the shell 1110 includes a hand-holdable shell. In an embodiment, the first heat-rejection element 1122 is located at a first side of the first exterior portion 1112 of the shell and the second heat-rejection element 1126 is located at a second side of a second exterior portion 1114 of the shell. For example, a first exterior portion may include a front, back, or one of the sides. The second exterior portion would include an opposite side, or an adjacent side. Alternatively, the first heat-rejection element and the second heat-rejection element may be spaced apart on a same side.

In an embodiment, the controllable thermal coupler 1130 includes a controllable thermal coupler thermally coupled between the heat-generating component 1115 and (i) the first heat-rejection element 1122 and (ii) the second heat-rejection element 1126. In an embodiment, the controllable thermal coupler includes a first heat receiving element 1138 in thermal contact with the heat-generating component. In an embodiment, the controllable thermal coupler includes a second heat receiving element (not illustrated) also in thermal contact with the heat-generating component.

In an embodiment, the portable electronic device 1105 further includes a second proximity sensor 1146 configured to determine if a second user touch to the shell 1110 is within a second zone of possible heat discomfort (not illustrated) defined for the second heat-rejection element 1126. The second proximity sensor has a proximity 1147 to the second heat-rejection element. In an embodiment, the regulated heat transfer includes adjusting heat rejection away from the first heat-rejection element 1122 and toward the second heat-rejection element 1126 if (i) the user touch is determined to be within the first zone of possible heat discomfort 270 and (ii) a second user touch is determined not to be within the second zone of possible heat discomfort. In an embodiment, the regulated heat transfer includes decreasing heat rejection from the first heat-rejection element and increasing heat rejection from the second heat-rejection element. In an embodiment, the regulated heat transfer includes terminating heat rejection from the first heat-rejection element and increasing heat rejection from the second heat-rejection element. In an embodiment, the regulated heat transfer includes vectoring heat transfer away from first heat-rejection element and toward the second heat-rejection element. In an embodiment, the regulated heat transfer includes limiting rejection of heat by the first heat-rejection element to a predetermined temperature. For example, limiting rejection of heat may be by reference to an exterior surface of the first heat-rejection element or by reference to air discharged by or touched by the first heat-rejection element. In an embodiment, the portable electronic device includes a temperature sensor 1188 configured to determine an exterior temperature of a portion of the shell 1110. In an embodiment, the thermal manager 1150 includes a library of heat-reduction strategies 1152.

FIG. 12 illustrates an example operational flow 1200 limiting exterior temperatures encountered by a user of a portable electronic device having an exterior shell and a heat generating component. After a start operation, the operational flow includes a touch assessment operation 1210. The touch assessment operation includes determining if a user touch to the shell is within a first zone of possible heat discomfort defined for a first heat-rejection element. In an embodiment, the touch assessment operation may be implemented using the thermal manager 1150 described in conjunction with FIG. 11. A choosing operation 1220 includes selecting a heat rejection strategy responsive to a determination that the user touch to the shell is within the first zone of possible heat discomfort. The selected heat rejection strategy includes adjusting heat rejection away from the first heat-rejection element and toward the second heat-rejection element. In an embodiment, the choosing operation may be implemented using the thermal manager 1150, and optionally from among at least two heat-reduction strategies of the library of heat-reduction strategies 1152, as described in conjunction with FIG. 11. A control operation 1230 includes regulating heat transfer to the first heat-rejection element and to the second heat-rejection element in response to the selected heat rejection strategy. In an embodiment, the control operation may be implemented using the controllable thermal coupler 1130 described in conjunction with FIG. 11. The operational flow includes an end operation. The first heat-rejection element is located at a first exterior portion of the shell. The second heat-rejection element located at a second exterior portion of the shell. Each heat-rejection element is configured to reject heat received from the heat-generating component into an environment in thermal contact with the shell.

In an embodiment, the choosing operation 1220 includes selecting a heat rejection strategy responsive to (i) a determination that the user touch to the shell is within the first zone of possible heat discomfort and (ii) a duration of the user touch within the first zone of possible heat discomfort. In an embodiment, the control operation 1230 includes regulating heat transfer from the heat-generating device to the first heat-rejection element and to second heat-rejection element. In an embodiment, the selecting includes selecting a heat regulating strategy vectoring heat transfer away from the first heat-rejection element and toward the second heat-rejection element in response to the selected heat rejection strategy. In an embodiment, the selecting includes selecting a heat regulating strategy limiting rejection of heat by the first heat-rejection element to a predetermined temperature.

FIG. 13 illustrates an example system 1300 for limiting exterior temperatures encountered by a user of a portable electronic device. The system includes means 1310 for determining if a user touch to a shell of the portable electronic device is within a first zone of possible heat discomfort defined for a first heat-rejection element of the portable electronic device. The system includes means 1320 for selecting a heat rejection strategy responsive to a determination that the user touch to the shell is within the first zone of possible heat discomfort. The selected heat rejection strategy includes adjusting heat rejection away from the first heat-rejection element and toward the second heat-rejection element. The system includes means 1330 for regulating heat transfer to the first heat-rejection element and to a second heat-rejection element in response to the selected heat rejection strategy. The first heat-rejection element is located at a first exterior portion of the shell, and the second heat-rejection element is located at a second exterior portion of the shell. Each heat-rejection element is configured to reject heat received from the heat-generating component of the portable electronic device into an environment in thermal contact with the shell.

Figure 15:
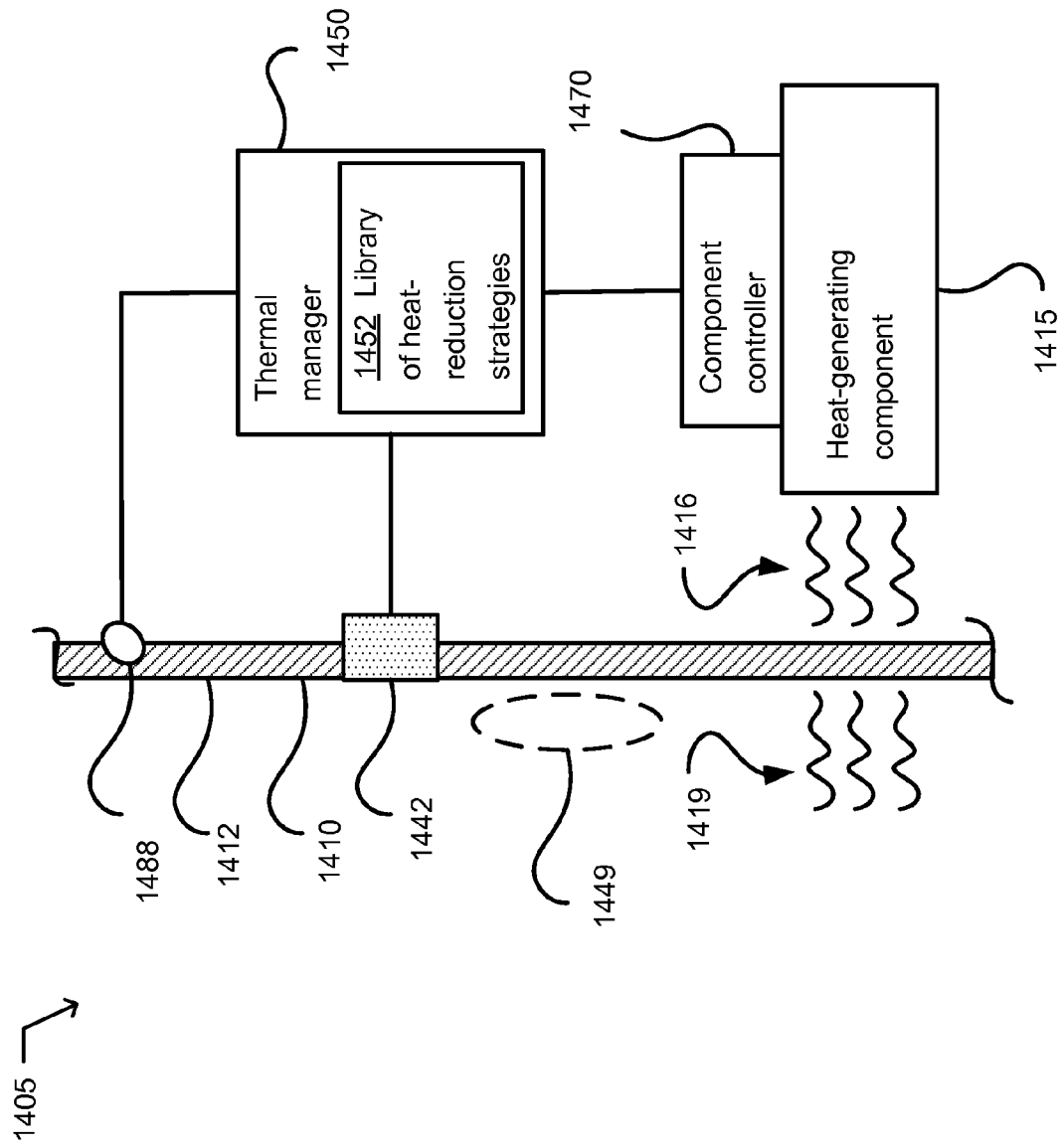
FIG. 15 further illustrates a schematic view of the embodiment of the portable electronic device 1405 of FIG. 14.

FIG. 14 illustrates an example environment 1400 in which embodiments may be implemented. The environment includes an embodiment of a portable electronic device 1405, and a user of the portable electronic device, illustrated as the person 290 having the hand 292 capable of touching, holding, or contacting the electronic device. FIG. 15 further illustrates a schematic view of the embodiment of the portable electronic device 1405 of FIG. 14. This portion of the detailed description will employ both FIGS. 14 and 15 to describe of the portable electronic device 1405.

The portable electronic device 1405 includes a system for limiting exterior temperatures encountered by the user 290 of the portable electronic device. The portable electronic device includes a shell 1410 housing a heat-generating component 1415. The portable electronic device includes a contact sensor 1442 configured to determine a user touch 1449 to the shell. For example, a finger or palm of the hand 292 of the user 290 may contact or hold the shell of the portable electronic device during use of the portable electronic device. The portable electronic device includes a temperature sensor 1488 configured to determine an exterior temperature of the shell.

The portable electronic device includes a thermal manager 1450 configured to reduce the exterior shell temperature 1419 by regulating heat generation 1416 by the heat-generating component. The regulating heat generation is responsive to the determined user touch and the determined temperature of the shell. In an embodiment, the portable electronic device 1405 may be implemented using the thin computing device 20 described in conjunction with FIG. 1. In an embodiment, the portable electronic device may be implemented using the general computing device 110 described in conjunction with FIG. 2.

In an embodiment, the thermal manager 1450 is configured to reduce the exterior shell temperature by limiting heat generation by the heat-generating component generation. In an embodiment, the shell 1410 includes a hand-holdable shell. In an embodiment, the contact sensor 1442 is configured to determine an occurrence of a user touch 1449 to an exterior portion 1412 of the shell 1410. In an embodiment, the contact sensor is configured to determine a location of a user touch to an exterior portion of the shell. In an embodiment, the temperature sensor 1488 is configured to measure an exterior temperature of the shell. In an embodiment, the temperature sensor is configured to predict an exterior temperature of the shell. For example, a prediction may be based on estimates or history of heat generation by the heat-generating component. For example, a prediction may be based on an interior temperature of the portable electronic device. For example, a prediction may be based on correlations (i.e., made by the manufacturer or a testing facility) between levels of heat generation or interior temperatures with external temperatures at various locations on the shell. In an embodiment, the temperature sensor is configured to measure a temperature of a first exterior portion of the shell. In an embodiment, the temperature sensor is configured to determine a temperature of the shell substantially concurrent with the determined occurrence of the user touch to the shell. For example, substantially concurrent may include happening at about the same time, i.e., within about one second, five seconds, ten seconds, or one minute. In an embodiment, the temperature sensor is configured to determine a temperature of a same outside portion of the shell as the user touch to the shell. In an embodiment, the temperature sensor is configured to determine a temperature of the shell within about 2 cm of a determined location of the user touch to the shell. In an embodiment, the temperature sensor is configured to determine a temperature of the shell within about 1 cm of a determined location of the user touch to the shell. In an embodiment, the contact sensor is further configured to determine a duration of a user touch to the shell. In an embodiment, the shell includes another exterior portion 1414 and a display screen 1486.

In an embodiment, the thermal manager 1450 includes a thermal manager configured to regulate heat generation 1416 by the heat-generating component 1415 in response to (i) the determined user touch 1449 and (ii) the determined temperature of the shell exceeding a threshold value. In an embodiment, the thermal manager includes a thermal manager configured to regulate heat generation by the heat-generating component in response to (i) a location of the determined user touch, and (ii) a measured temperature of the shell exceeding a threshold value. In an embodiment, the thermal manager includes a thermal manager configured to regulate heat generation by the heat-generating component in response to (i) the determined user touch, (ii) a duration of the user touch, and (iii) the determined temperature of the shell exceeding a threshold value. In an embodiment, the thermal manager includes a thermal manager configured to limit heat generation by initiating a slowdown in a clock speed of a processor of the portable electronic device in response to the determined user touch. For example, a slowdown in clock speed of a processor may be implemented by a component controller 1470 in communication with the thermal manager. In an embodiment, the thermal manager includes a thermal manager configured to limit heat generation by initiating a slowdown in clock speed of a processor of the portable electronic device in response to the determined user touch and in response to a measured temperature of a first external portion of the shell exceeding a threshold value. In an embodiment, the thermal manager includes a thermal manager configured to regulate heat generation by terminating, delaying, or slowing down execution of an application or process. In an embodiment, the thermal manager includes a thermal manager configured to regulate heat generation by terminating, delaying, or slowing down execution of an application or process drawing current from an energy storage device, such as a battery, of the portable electronic device greater than a current limitation. For example, the current limitation may be a predetermined limitation, or a dynamically determined limitation based on factors related to an aspect of the electronic device, the particular application, or the particular process involved. For example, different current limitations may be selected in response to high display demands, or high storage media or volatile media activity. In an embodiment, the thermal manager includes a thermal manager configured to limit heat generation by reducing a core voltage of a processor of the portable electronic device in response to the determined user touch. In an embodiment, the thermal manager includes a thermal manager configured to select from a library of heat-rejection strategies a heat rejection strategy responsive to the exterior temperature of the shell, and to regulate heat generation by the heat-generating component in response to the selected heat rejection strategy.

Figure 16:
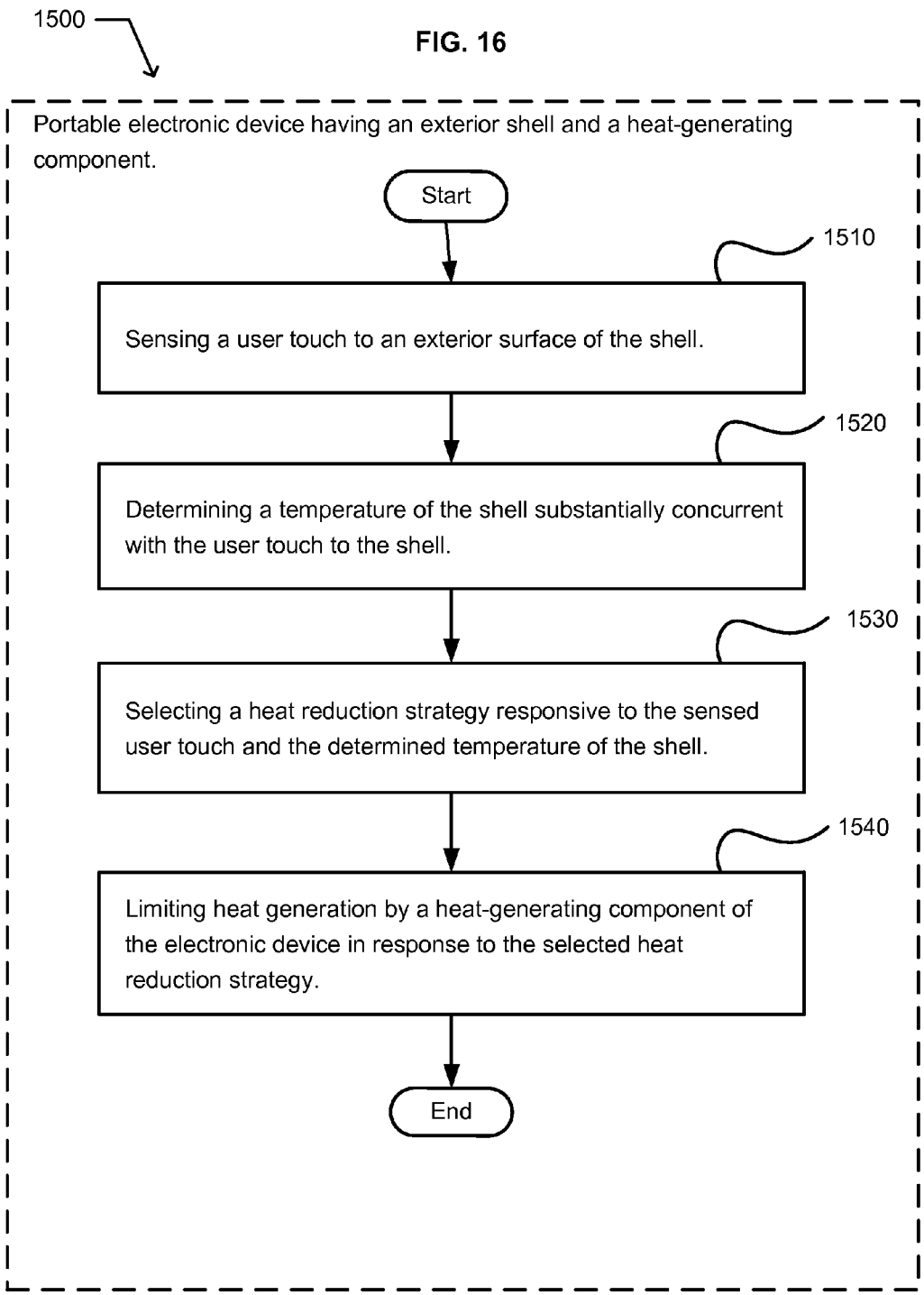
FIG. 16 illustrates an example operational flow 1500 implemented in a portable electronic device having an exterior shell and a heat-generating component.

FIG. 16 illustrates an example operational flow 1500 implemented in a portable electronic device having an exterior shell and a heat-generating component. After a start operation, the operational flow includes a recognition operation 1510. The recognition operation includes sensing a user touch to an exterior surface of the shell. In an embodiment, the recognition operation may be implemented using the contact sensor 1442 described in conjunction with FIGS. 13 and 14. An evaluating operation 1520 includes determining a temperature of the shell substantially concurrent with the user touch to the shell. In an embodiment, the evaluating operation may be implemented using the temperature sensor 1488, and optionally the thermal manager 1450, described in conjunction with FIGS. 13 and 14. In an embodiment, the evaluating operation may be implemented by a prediction of the shell temperature (e.g., based on values of heat generation or interior temperatures). A choosing operation 1530 includes selecting a heat reduction strategy responsive to the sensed user touch and the determined temperature of the shell. In an embodiment, the choosing operation may be implemented using the thermal manager 1450 described in conjunction with FIGS. 13 and 14. A control operation 1540 includes limiting heat generation by a heat-generating component of the electronic device in response to the selected heat reduction strategy. In an embodiment, the control operation may be implemented using the thermal manager 1450, and optionally the component controller 1470, described in conjunction with FIGS. 13 and 14. The operational flow includes an end operation.

Returning to FIGS. 14 and 15, an example alternative embodiment of the portable electronic device 1405 is also illustrated by these figures. The portable electronic device 1405 includes a system for limiting exterior shell temperatures encountered by a user. The portable electronic device includes the shell 1410 housing the portable electronic device and the heat-generating component 1415. The portable electronic device includes a temperature sensor 1488 configured to measure a temperature of an external portion 1412 of the shell. The portable electronic device includes a thermal manager 1450 configured to limit heat generation 1416 by the heat-generating component in response to the measured temperature of the shell.

In an embodiment, the shell 1410 includes a hand-holdable shell housing the portable electronic device 1405. In an embodiment, the thermal manager 1450 includes a thermal manager configured to limit heat generation 1416 by the heat-generating component 1415 in response to a measured temperature of the shell exceeding a threshold value. In an embodiment, the thermal manager includes a thermal manager configured to limit heat generation by slowing down a clock speed of a processor of the portable electronic device in response to the measured temperature of the shell. In an embodiment, the thermal manager includes a thermal manager configured to limit heat generation by terminating, delaying, or slowing down execution of an application or process in response to the measured temperature of the shell. In an embodiment, the thermal manager includes a thermal manager configured to limit heat generation by terminating, delaying, or slowing down execution of an application or process drawing current from an energy storage device of the portable electronic device greater than a current limit. In an embodiment, the thermal manager includes a thermal manager configured to limit heat generation by reducing a core voltage of a processor of the portable electronic device in response to the measured temperature of the shell.

FIG. 17 illustrates an example operational flow 1600 implemented in a portable electronic device having a shell and a heat-generating component. After a start operation, the operational flow includes an evaluation operation 1610. The evaluating operation includes measuring a temperature of the shell. In an embodiment, the evaluating operation may be implemented using the temperature sensor 1488, and optionally the thermal manager 1450, described in conjunction with FIGS. 13 and 14. A choosing operation 1620 includes selecting a heat reduction strategy responsive to the measured temperature of the shell. In an embodiment, the choosing operation may be implemented using the thermal manager 1450 described in conjunction with FIGS. 13 and 14. A control operation 1630 includes limiting a heating generation by a heat-generating component of the electronic device in response to the selected heat reduction strategy. In an embodiment, the control operation may be implemented using the thermal manager 1450, and optionally the component controller 1470, described in conjunction with FIGS. 13 and 14. The operational flow includes an end operation.

In an embodiment of the evaluating operation 1620, the measuring includes measuring a temperature of an exterior surface of the shell. In an embodiment of the choosing operation 1630, the selecting a heat reduction strategy includes selecting the heat-generating component to be regulated by the heat reduction strategy from among at least two possible heat-generating components of the portable electronic device. In an embodiment, a heat-generating component includes a heat-generating component configured to be directly or indirectly limited in its heat generation. In an embodiment, the selecting a heat reduction strategy includes selecting a heat-reduction strategy limiting an exterior surface temperature of the shell to a predetermined temperature. In an embodiment, the selecting a heat reduction strategy includes selecting a heat-reduction strategy slowing down a clock speed of a processor of the portable electronic device in response to the measured temperature of the shell. In an embodiment, the selecting a heat reduction strategy includes selecting a heat-reduction strategy terminating, delaying, or slowing down execution of an application or process in response to the measured temperature of the shell. In an embodiment, the selecting a heat reduction strategy includes selecting a heat-reduction strategy reducing a core voltage of a processor of the portable electronic device in response to the measured temperature of the shell. In an embodiment, the selecting a heat reduction strategy includes selecting a heat reduction strategy from a library 1452 of at least two heat-reduction strategies.

All references cited herein are hereby incorporated by reference in their entirety or to the extent their subject matter is not otherwise inconsistent herewith.

In some embodiments, "configured" includes at least one of designed, set up, shaped, implemented, constructed, or adapted for at least one of a particular purpose, application, or function.

It will be understood that, in general, terms used herein, and especially in the appended claims, are generally intended as "open" terms. For example, the term "including" should be interpreted as "including but not limited to." For example, the term "having" should be interpreted as "having at least." For example, the term "has" should be interpreted as "having at least." For example, the term "includes" should be interpreted as "includes but is not limited to," etc. It will be further understood that if a specific number of an introduced claim recitation is intended, such an intent will be explicitly recited in the claim, and in the absence of such recitation no such intent is present. For example, as an aid to understanding, the following appended claims may contain usage of introductory phrases such as "at least one" or "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a receiver" should typically be interpreted to mean "at least one receiver"); the same holds true for the use of definite articles used to introduce claim recitations. In addition, even if a specific number of an introduced claim recitation is explicitly recited, it will be recognized that such recitation should typically be interpreted to mean at least the recited number (e.g., the bare recitation of "at least two chambers," or "a plurality of chambers," without other modifiers, typically means at least two chambers).

In those instances where a phrase such as "at least one of A, B, and C," "at least one of A, B, or C," or "an [item] selected from the group consisting of A, B, and C," is used, in general such a construction is intended to be disjunctive (e.g., any of these phrases would include but not be limited to systems that have A alone, B alone, C alone, A and B together, A and C together, B and C together, or A, B, and C together, and may further include more than one of A, B, or C, such as $A_1$, $A_2$, and C together, A, $B_1$, $B_2$, $C_1$, and $C_2$ together, or $B_1$ and $B_2$ together). It will be further understood that virtually any disjunctive word or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

The herein described aspects depict different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality. Any two components capable of being so associated can also be viewed as being "operably couplable" to each other to achieve the desired functionality. Specific examples of operably couplable include but are not limited to physically mateable or physically interacting components or wirelessly interactable or wirelessly interacting components.

With respect to the appended claims the recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Use of "Start," "End," "Stop," or the like blocks in the block diagrams is not intended to indicate a limitation on the beginning or end of any operations or functions in the diagram. Such flowcharts or diagrams may be incorporated into other flowcharts or diagrams where additional functions are performed before or after the functions shown in the diagrams of this application. Furthermore, terms like "responsive to," "related to," or other past-tense adjectives are generally not intended to exclude such variants, unless context dictates otherwise.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A portable electronic device comprising:
a shell housing components of the portable electronic device;
a heat-generating component;
a heat-rejection element configured to reject heat received from a controllable thermal coupler into an environment in thermal contact with the heat-rejection element;
the controllable thermal coupler configured to regulate a transfer of heat originated by the heat-generating element to the heat-rejection element;
an activity monitor configured to infer a user touch to the shell in response to a detected activity of the portable electronic device; and
a thermal manager configured to select from a library of at least two heat-rejection strategies a heat rejection strategy responsive to an aspect of the inferred user touch, and to regulate heat transfer by the controllable thermal coupler to the heat-rejection element in response to the inferred user touch and the selected heat reduction strategy.

2. The portable electronic device of claim 1, wherein the activity monitor is further configured to infer a location of the user touch to the shell in response to a detected activity of the portable electronic device.

3. A portable electronic device comprising: a shell housing components of the portable electronic device; a heat-generating component; a heat-rejection element configured to reject heat received from a controllable thermal coupler into an environment in thermal contact with the heat-rejection element; the controllable thermal coupler configured to regulate a transfer of heat originated by the heat-generating element to the heat-rejection element; an activity monitor configured to infer a user touch to the shell in response to a detected activity of the portable electronic device; and a thermal manager configured to select from a library of at least two heat-rejection strategies a heat rejection strategy responsive to an aspect of the inferred user touch, and to regulate heat transfer by the controllable thermal coupler to the heat-rejection element in response to the inferred user touch and the selected heat reduction strategy, wherein the detected activity of the portable electronic device includes a detected spatial movement of the shell having a characteristic of a user interaction with the portable electronic device.

4. The portable electronic device of claim 1, wherein the detected activity of the portable electronic device includes a detected user-initiated action executing on the portable electronic device.

5. The portable electronic device of claim 1, wherein the detected activity of the portable electronic device includes a detected aspect of a movement of the shell having a characteristic of a user-imparted movement.

6. The portable electronic device of claim 1, wherein the detected activity of the portable electronic device includes an accelerometer detected movement of the shell having a characteristic of a user-imparted movement.

7. The portable electronic device of claim 1, wherein the detected activity of the portable electronic device includes the portable electronic device being in a pocket mode state.

8. The portable electronic device of claim 1, wherein the heat-rejection element is located at an exterior surface of the shell.

9. The portable electronic device of claim 1, wherein the heat-rejection element is configured to reject heat originated by the heat-generating component and received from the controllable thermal coupler.

10. The portable electronic device of claim 1, wherein the heat-rejection element is configured to discharge heat received from the controllable thermal coupler.

11. The portable electronic device of claim 1, wherein the heat-rejection element includes an array of heat-rejection elements, and heat transfer to at least two heat-rejection elements of the array of heat-rejection elements is separately controllable by the controllable thermal coupler.

* * * * *